United States Patent
Baarman et al.

(10) Patent No.: US 10,187,042 B2
(45) Date of Patent: Jan. 22, 2019

(54) WIRELESS POWER CONTROL SYSTEM

(71) Applicant: Philips IP Ventures B.V., Eindhoven (NL)

(72) Inventors: David W. Baarman, Fennville, MI (US); Benjamin C. Moes, Wyoming, MI (US); Joshua K. Schwannecke, Grand Rapids, MI (US); Joshua B. Taylor, Rockford, MI (US); Neil W. Kuyvenhoven, Ada, MI (US); Matthew J. Norconk, Grand Rapids, MI (US); Colin J. Moore, Lowell, MI (US); John James Lord, Springfield, IL (US); Kristen J. Blood, Gainesville, FL (US)

(73) Assignee: PHILIPS IP VENTURES B.V., Eindhoven (NL)

( * ) Notice: Subject to any disclaimer, the term of this patent is extended or adjusted under 35 U.S.C. 154(b) by 1211 days.

(21) Appl. No.: 14/370,384

(22) PCT Filed: Jan. 23, 2013

(86) PCT No.: PCT/US2013/022662
§ 371 (c)(1),
(2) Date: Jul. 2, 2014

(87) PCT Pub. No.: WO2013/112526
PCT Pub. Date: Aug. 1, 2013

(65) Prior Publication Data
US 2015/0035376 A1    Feb. 5, 2015

Related U.S. Application Data

(60) Provisional application No. 61/699,582, filed on Sep. 11, 2012, provisional application No. 61/590,080, filed on Jan. 24, 2012.

(51) Int. Cl.
*H01F 38/14* (2006.01)
*H03J 7/04* (2006.01)
(Continued)

(52) U.S. Cl.
CPC ............ *H03J 7/04* (2013.01); *H01F 38/14* (2013.01); *H02J 5/005* (2013.01); *H02J 7/025* (2013.01); *H02J 50/12* (2016.02); *H04B 5/0037* (2013.01)

(58) Field of Classification Search
CPC . H01F 38/14; H02J 5/005; H02J 50/12; H02J 7/025; H02J 17/00; H03J 7/04; H04B 5/0037; B60L 11/182
(Continued)

(56) References Cited

U.S. PATENT DOCUMENTS

| 645,576 A | 3/1900 | Tesla |
| 685,012 A | 10/1901 | Tesla |

(Continued)

FOREIGN PATENT DOCUMENTS

| CN | 1143227 | 2/1997 |
| CN | 101828339 | 9/2010 |

(Continued)

OTHER PUBLICATIONS

International Search Report and Written Opinion of the International Searching Authority for International Application No. PCT/US13/22662 dated Jun. 5, 2013.

(Continued)

*Primary Examiner* — Thienvu Tran
*Assistant Examiner* — Brian K Baxter
(74) *Attorney, Agent, or Firm* — Larry Liberchuk

(57) ABSTRACT

A wireless power transfer component with a selectively adjustable resonator circuit having a Q control subcircuit that varies the Q factor of the resonator circuit to control the (Continued)

amount of power relayed by the resonator circuit. The resonator circuit may be in the wireless power supply, the wireless power receiver, an intermediate resonator or any combination thereof. The resonator circuit may be actively configured based on a feedback circuit. The feedback circuit may sense a characteristic in the secondary circuit or elsewhere and actively operate the control subcircuit based on the sensed characteristic. The feedback circuit may cause the Q control subcircuit to change (reduce or increase) the Q factor when the sensed characteristic crosses a threshold value. The Q control subcircuit may include a variable resistor having a value that can be varied to adjust the Q factor of the resonator circuit.

58 Claims, 36 Drawing Sheets

(51) Int. Cl.
*H02J 50/12* (2016.01)
*H02J 5/00* (2016.01)
*H02J 7/02* (2016.01)
*H04B 5/00* (2006.01)

(58) Field of Classification Search
USPC .......................................................... 307/104
See application file for complete search history.

(56) References Cited

U.S. PATENT DOCUMENTS

| | | | |
|---|---|---|---|
| 4,802,080 A | 1/1989 | Bossi et al. | |
| 5,045,770 A | 9/1991 | Brooks | |
| 5,565,846 A | 10/1996 | Geiszler et al. | |
| 5,801,372 A | 9/1998 | Yamaguchi | |
| 6,705,441 B1 | 3/2004 | Boys et al. | |
| 6,917,182 B2 | 7/2005 | Burton et al. | |
| 8,259,429 B2 | 9/2012 | Lee | |
| 2009/0015075 A1 | 1/2009 | Cook et al. | |
| 2009/0058189 A1 | 3/2009 | Cook et al. | |
| 2009/0174263 A1 | 7/2009 | Baarman et al. | |
| 2010/0052431 A1 | 3/2010 | Mita | |
| 2010/0117454 A1 | 5/2010 | Cook et al. | |
| 2010/0289449 A1* | 11/2010 | Elo | H02J 5/005 320/108 |
| 2010/0320962 A1* | 12/2010 | Sekita | H02J 7/025 320/108 |
| 2011/0053500 A1 | 3/2011 | Menegoli et al. | |
| 2011/0095618 A1 | 4/2011 | Schatz et al. | |
| 2011/0133569 A1 | 6/2011 | Cheon et al. | |
| 2011/0241436 A1 | 10/2011 | Furukawa | |
| 2011/0266881 A1 | 11/2011 | Kim et al. | |
| 2011/0285349 A1 | 11/2011 | Widmer et al. | |
| 2011/0304216 A1 | 12/2011 | Baarman | |
| 2012/0001493 A1 | 1/2012 | Kudo et al. | |
| 2012/0049791 A1* | 3/2012 | Tanabe | H02J 50/60 320/108 |
| 2012/0051109 A1 | 3/2012 | Kim et al. | |
| 2012/0056485 A1* | 3/2012 | Haruyama | H02J 5/005 307/104 |
| 2013/0002034 A1 | 1/2013 | Onizuka et al. | |
| 2013/0043837 A1 | 2/2013 | Sekita et al. | |
| 2013/0049481 A1* | 2/2013 | Kudo | G06K 7/0008 307/104 |
| 2013/0069442 A1* | 3/2013 | Kim | H02J 5/005 307/104 |
| 2013/0187598 A1* | 7/2013 | Park | H02J 7/0042 320/108 |

FOREIGN PATENT DOCUMENTS

| | | |
|---|---|---|
| EP | 2 306 617 | 4/2011 |
| EP | 2 369 711 | 9/2011 |
| JP | H08-340650 | 12/1996 |
| JP | 2000-270501 | 9/2000 |
| JP | 2010-051137 | 3/2010 |
| JP | 2011-244684 | 12/2011 |
| WO | 89/10030 | 10/1989 |
| WO | 2009/054221 | 4/2009 |
| WO | 2010/041318 | 4/2010 |
| WO | 2010/126010 | 11/2010 |
| WO | 2011033660 | 3/2011 |
| WO | 2011/156555 | 12/2011 |
| WO | 2013/103756 | 7/2013 |
| WO | 2013/103939 | 7/2013 |

OTHER PUBLICATIONS

Shen, F.Z., et al., "Circuit Analysis of Wireless Power Transfer by Coupled Magnetic Resonance", pp. 602-605.
Screen shots of YouTube video entitled, "eCoupled Wireless Power Through Granite", uploaded on Jun. 6, 2011, and available at https://www.youtube.com/watch?v=1Lvd4dMIoEY.

* cited by examiner

THERMAL IMAGE
SYSTEM WITH QCONTROL ACTIVE AFTER 15
MINUTES

SIMPLE RECIEVER CONFIGURATION

LABEL FOIL PRINTED LAYERS

CLOSE-RANGE / MID-RANGE FIELDS

CLOSE-RANGE / MID-RANGE FIELDS

FLOW DIAGRAM - MID RANGE TRANSMITTER

FLOW DIAGRAM - CLOSE COUPLED TRANSMITTER

CIRCUIT ANALYSIS OF 4 COIL SYSTEM

WIRELESS POWER CONTROL SYSTEM

BACKGROUND OF THE INVENTION

The present invention relates to wireless power transfer.

The use of wireless power supply systems continues to grow. The most common wireless power supply systems use electromagnetic fields to wirelessly transfer power from a wireless power supply to wireless power receiver associated with a remote device, such as a cell phone, a smart phone, a media player or other electronic device. There are a number of different types of wireless power supply systems. For example, many conventional systems use a primary coil in the wireless power supply and secondary coil in the wireless power receiver of the remote device. The primary coil generates an electromagnetic field that emanates from the wireless power supply. The wireless power receiver includes a secondary coil that can be placed within the electromagnetic field generated by the primary coil. When the remote device is placed within sufficient proximity to the wireless power supply, the electromagnetic field induces power within the secondary coil that can be used by the remote device, for example, to power and/or charge the remote device. These types of systems typically provide optimal performance when the primary coil and the secondary coil are relatively close to one another. For this reason, these types of systems are often referred to as "close-coupled" systems.

A number of conventional wireless power supply systems have been configured to efficiently provide power when the primary coil and the secondary coil are farther apart than normally acceptable for efficient use of close-coupled systems. Given that they can efficiently transfer power at distances greater than close-coupled systems, these types of wireless power transfer systems are often referred to as "mid-range" systems. A typical mid-range wireless power transfer system relies on technology disclosed over 100 years ago by Nicola Tesla (see for example, U.S. Pat. No. 685,012, which issued on Oct. 22, 1901).

With a typical mid-range system, the power transfer system includes a pair of resonators that are arranged between or otherwise near the primary coil and the secondary coil. Each resonator is configured to include an inductor and a capacitor, and does not include any additional significant load. This keeps the impedance at the resonant frequency to a minimum which maximizes the resonating current between the capacitor and inductor. The current in the inductor, in turn, amplifies the wireless power signal induced within the resonator. Given their ability to amplify signals, the resonators can function as a bridge for extending the range of the wireless power supply system. In use, the primary coil generates an electromagnetic field that induces power in the first resonator, the first resonator generates an amplified electromagnetic field that induces power in the second resonator and the second resonator generates an amplified electromagnetic field that induces power in the secondary coil. For example, FIG. 1 illustrates one embodiment of a known wireless power supply system. The wireless power system of FIG. 1 includes a wireless power supply and a wireless receiver. The wireless power supply includes a connection to a mains input, an AC/DC power supply, an inverter for switching the DC power to AC, a tank circuit including a capacitor and an inductor L1. When energized the tank circuit inductor L1 couples to the isolated resonator circuit including the inductor L2 and the capacitor. The wireless receiver includes an isolated resonator circuit with an inductor L3 and a capacitor that couples with the isolates resonator circuit of the wireless power supply. The isolated resonator circuit of the wireless receiver relays power to the secondary circuit of the wireless receiver. The secondary circuit of the wireless receiver includes a secondary inductor L4, a capacitor, a rectifier, a controller and a load.

Although the use of resonators typically provides improved efficiency in mid-range environments, resonators can reduce efficiency when the wireless power supply and the remote device are too close. It is also possible for a resonator to relay more available power, leading to higher voltages than desired in some applications. This can lead to reduce the system's overall efficiency, generate significant heating and produce excessive voltages and circulating currents at the receiver.

SUMMARY OF THE INVENTION

The present invention provides a wireless power transfer component with a selectively adjustable resonator circuit to control the amount of power relayed by the resonator. The resonator circuit can be in the wireless power supply, the wireless receiver, an intermediate resonator or any combination thereof.

In one embodiment, the resonator circuit is actively configured based on secondary circuit feedback. In one embodiment, the secondary circuit feedback is a function of a threshold value. For example, a temperature, voltage, current, or power threshold. In another embodiment, the resonator circuit is actively configured based on feedback from outside the secondary circuit, such as a temperature sensor on a battery.

The resonator circuit can include a control subcircuit for configuring the resonator circuit. In one embodiment, the control subcircuit is connected to the resonator inductor in parallel to the resonator capacitor and selectively shunts the resonator capacitor or selectively provides a resistance that is parallel to the resonator capacitor. In one embodiment, the control subcircuit is in series with the resonator inductor and the resonator capacitor. In one embodiment the control subcircuit includes a switch that selectively shunts the resonator capacitor or selectively provides a resistance that is parallel to the resonator capacitor. The switch may be one or more transistors or another switching element. In one embodiment the control subcircuit includes a rectifier and the switch is located on the rectified side. In one embodiment the control subcircuit includes a switch capable of operating with AC.

In one embodiment, the control subcircuit varies the quality factor, or "Q factor", of the resonator circuit to vary the amount of power relayed to the secondary circuit. In one embodiment, the control subcircuit is actively controlled by feedback to reduce the amount of power relayed by the resonator circuit to the secondary circuit.

In one embodiment, the secondary circuit includes a feedback circuit that actuates the control subcircuit. The feedback circuit may sense a characteristic in the secondary circuit and actively operate the control subcircuit. The feedback circuit may operate the control subcircuit to satisfy a threshold. In one embodiment the feedback circuit may cause the control subcircuit to change (reduce or increase) the Q factor of the resonator circuit when the threshold value is crossed.

In one embodiment, the control subcircuit includes a component capable of functioning as a variable resistor. The component may be a transistor operating in the triode mode or linear region. The feedback circuit may be capable of providing a proportional feedback signal to the control subcircuit that controls the value of the variable resistor. The feedback circuit may include a controller capable of adjusting the feedback signal relative based on an algorithm. The algorithm may vary the feedback signal based on the relative difference between the actual and desired values of the sensed characteristic. For example, the controller may utilize a proportional, integral, derivative (PID) algorithm.

In one embodiment, the feedback circuit includes analog components that provide direct feedback to the control subcircuit. In one embodiment, the analog components provide a high or low signal depending on whether a threshold value is satisfied. In one embodiment, the feedback circuit includes digital controller. The digital controller may receive an analog input and generate a control signal for the control subcircuit.

In one embodiment, the resonator circuit can include a resonator shut off circuit. The resonator shut off circuit can be the control subcircuit or a switch that is separate from the control subcircuit. The resonator circuit or control subcircuit can include a sensor for providing information relevant to the control of the shut off circuit. For example, the resonator shut off circuit can be used to effectively eliminate the resonator circuit from the wireless receiver.

In one embodiment, the present invention can be incorporated into a wireless transmitter with a primary inductor that relays power through a primary resonator circuit. The wireless transmitter includes a control subcircuit to adjust the Q factor of the primary resonator circuit to regulate the amount of power emanating from the wireless transmitter. In one embodiment, the wireless transmitter includes a controller that operates the control subcircuit based on any desired control characteristic. For example, the wireless transmitter may limit the amount of power transmitted to correspond with the amount of power desired by the wireless receivers.

In one embodiment, the wireless transmitter is configured to operate in conjunction with wireless receivers with Q control. The wireless receivers may be configured to communicate their Q control status to the wireless transmitter. The wireless transmitter may be configured to reduce the Q factor of the resonator circuit when all of the wireless receivers are using Q control.

The present invention may provide a variety of benefits. In one embodiment, the present invention simple resonant feedback and Q control for a highly resonant system. The present invention may provide simple control for allowing one field transmitter to power many receivers, including receivers at different power levels. The present invention allows the control system to control Q at the transmitter and/or receiver, or in intermediate components. The present invention allows a transmitter with Q control to limit power or control Q allowing multiple proximity systems, such as close coupling and mid-range systems. In one embodiment, the present invention provides a simple battery charger and feedback system that can be incorporated into a label of a battery. The present invention may allow a system to control Q along with communicating the receiver's power needs while using rail voltage, phase control, or frequency to adjust for maximum efficiency. The present invention may allow analog Q control with digital monitoring and communications. In one embodiment, the present invention may be incorporated into a control system that allows fixed frequency, variable frequency, variable rail (amplitude), variable range (distance) and multiple power transfer protocols. The present invention allows control for switching between highly resonant systems loosely coupled and tightly coupled inductive systems. The present invention may incorporate a transmitter that can control power to many receivers at various distances, adjusting to the maximum distance with required power while the other receivers reduce Q to adjust power as needed. The present invention may allow Q control based on a variety of factors, such as voltage, current or temperature.

These and other objects, advantages, and features of the invention will be more fully understood and appreciated by reference to the description of the current embodiment and the drawings.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

BRIEF DESCRIPTION OF THE DRAWINGS

FIG. 15 is a representative view of three different charging surfaces, each having a different thickness, that the wireless receiver according to one embodiment may be capable of receiving power through.

DESCRIPTION OF THE CURRENT EMBODIMENT

Figure 1:
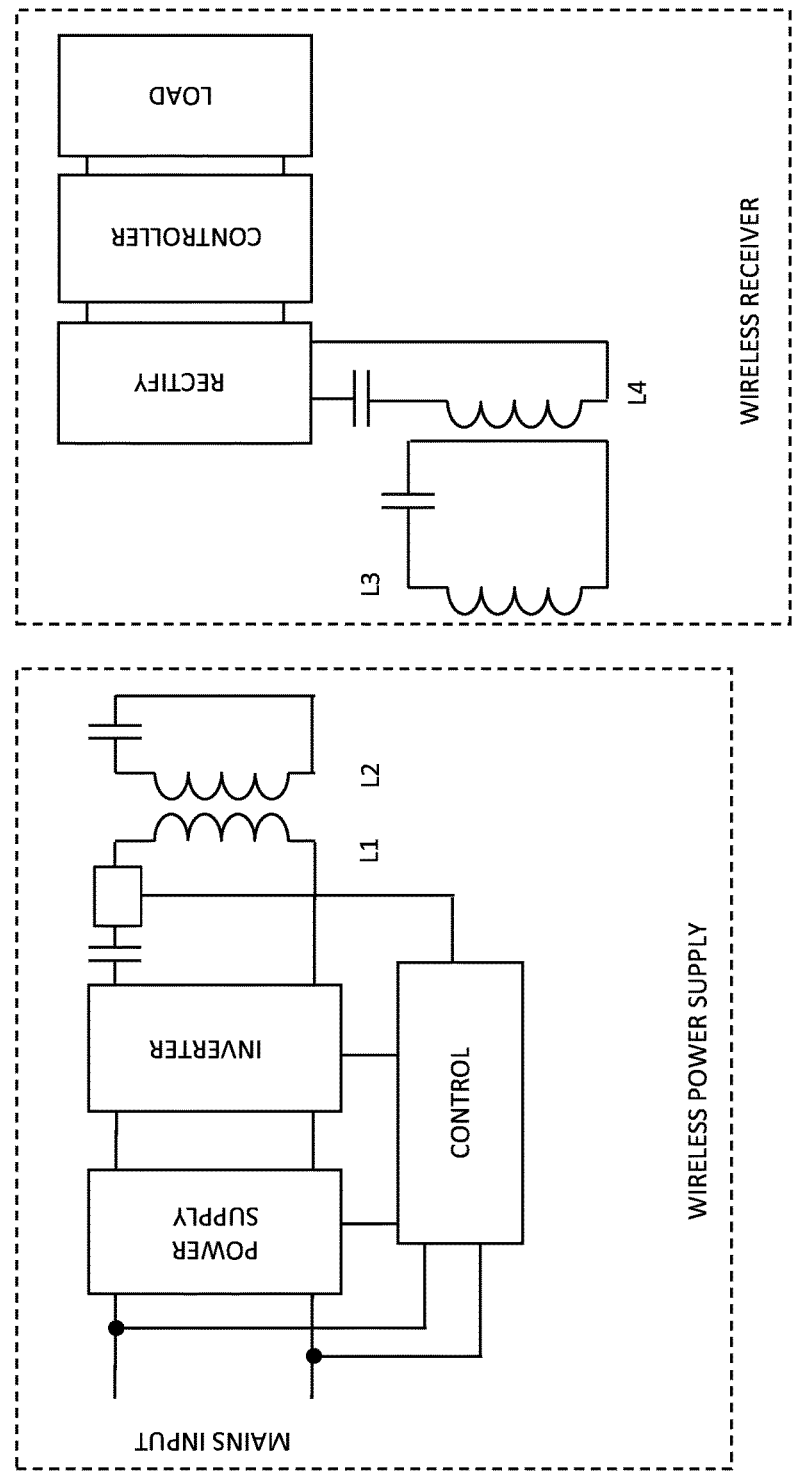
FIG. 1 is a representative view of a resonant wireless power supply system including a wireless power supply having a primary coil and a primary resonator and a wireless receiver having a secondary resonator and a secondary coil.
Figure 2:
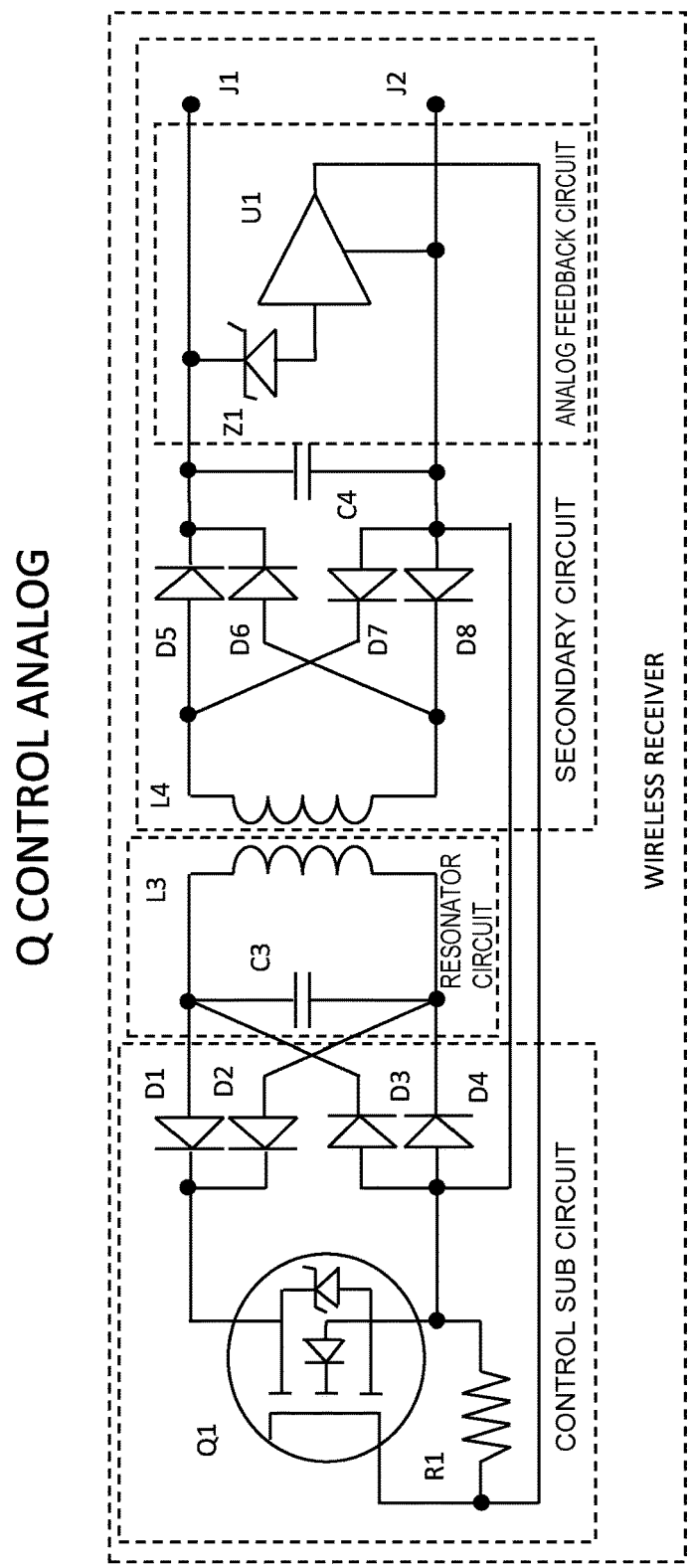
FIG. 2 is a representative schematic of a wireless receiver according to one embodiment.

Conventional mid-range wireless power systems may include resonators that relay power from the wireless power transmitter to the wireless power receiver. In general, the higher the Q factor of the resonators, the lower the rate of energy loss relative to the stored energy of the resonator. That is, the higher the Q factor, the slower the oscillations in the resonator die out. As a result, the Q factor of a resonator is relevant to the amount of power that can be relayed by the resonator at a given distance. A higher Q factor can result in higher power relay and a lower Q factor can reduce the amount of power relayed. Actively configuring one or more of the resonators to control the Q factor of the resonator circuit can allow regulation of the amount of power passing through the wireless power transfer system, such as by regulating the amount of power emanating from the wireless power supply or the amount of power received in the remote device. A wireless receiver in accordance with one embodiment of the present invention is shown in FIG. 2. In this embodiment, the wireless receiver includes a resonator circuit, a secondary circuit, and a control subcircuit for varying the Q factor of the resonator circuit by actively configuring the resonator based on feedback from the secondary circuit. In this embodiment, the control subcircuit is connected to the resonator inductor L3 in parallel to the resonator capacitor C3. The control subcircuit includes a transistor Q1 that can be actuated to selectively shunt the resonator capacitor C3, and thereby dramatically reduce the Q factor of the resonator. Although the Q factor of the resonator may be reduced, the induced current in the secondary resonator L3 may still extend the field to the secondary inductor L4. In this way, the power received in the secondary inductor L4 may be less than the amount that would otherwise be received if the Q factor were not reduced. When the resonating capacitor C3 is shunted, the secondary resonator L3 may act as a non-resonant, low Q resonator and extends a reduced amount of field to the secondary inductor L4. Although current may flow through the shunt, the shunt in this embodiment is not meant to waste excess power in the resonator. Rather, the lower Q of the circuit may resonate a smaller amount of the field to the secondary inductor L4, allowing the receiver to continue operating at an acceptable amount of voltage, power, or both.

As shown, the secondary circuit of this embodiment includes a feedback that is used in controlling operation of the transistor Q1. In this embodiment, the transistor Q1 is actuated to reduce the Q factor of the resonator when the feedback exceeds a threshold value. In operation, the wireless receiver can be placed in an electromagnetic field so that AC current is induced in the resonator circuit and power is relayed to the secondary circuit.

An adjustable resonator may be incorporated into essentially any component of the wireless power transfer system to allow power control at essentially any stage of power transfer. For example, an adjustable resonator may be incorporated into the wireless transmitter, the wireless receiver and/or an intermediate resonator in place of a conventional resonator. If the adjustable resonator is incorporated into an intermediate resonator, the circuit may be configured to resonate a certain amount of field, thereby potentially preventing an unacceptable amount of field localized around the intermediate resonator. For example, if a wireless power supply is located in the middle of a room and intermediate resonators are located around the room, each resonator may be configured to provide up to a certain amount of resonated field. This may prevent excess field levels from damaging remote devices when placed in proximity to the intermediate resonators. The intermediate resonators may determine a maximum or nominal field level based on the induced current or voltage in the resonating circuit, or may use an external field sensor.

As noted above, FIG. 2 is a schematic representation of a wireless receiver incorporating one embodiment of the present invention. The wireless receiver is configured to wirelessly receiver power from a wireless power transmitter (not shown). The wireless power transmitter may include a primary inductor that generates flux and a resonator. The wireless receiver may be coupled to a power input of a remote device. For example, J1 and J2 may be coupled to the power input of the remote device. For example, J1 and J2 may be output terminals, pads, or holes in the board for wires. The remote device may be essentially any component that utilizes electrical power. For example, the remote device may be a cell phone, a smart phone, a media player, a personal digital assistant, a laptop computer, a notebook or a tablet computer. The power delivered by the wireless receiver may be used in essentially any way, such as to directly power a remote device and/or to charge a battery for the remote device. The wireless receiver may be integrated directly into the remote device by the manufacturer. In such embodiments, the remote device may be configured to accommodate the wireless receiver within the housing of the remote device and the power input may be internal electrical connections that deliver power from the wireless power receiver to the power management unit (not shown) of the remote device. The power management unit (not shown) may control use of the power as desired, for example, by using conventional power control algorithms to provide power to the remote device or to charge the battery of the remote device. Alternatively, the wireless power receiver may be configured to attach to a remote device that was not intended to wirelessly receive power to allow that remote device to receive power wirelessly.

The wireless receiver of FIG. 2 generally includes a resonator circuit, a secondary circuit, and a control subcircuit. The resonator circuit can include a resonator inductor L3 and a resonator capacitor C3. The characteristics of the resonator inductor and resonator capacitor can vary depending on the application, desired secondary circuit output, or the selection of other circuit components. In the depicted embodiments, the resonator capacitor C3 is a high quality 0.1 uF 600V 3% metal polypro cap—Panasonic ECG ECW-F6104HL and the resonator inductor L3 is a planar wound coil with 12 turns, 28 AWG, 40 mm, for example. In other embodiments, the resonator inductor L3 may be any other type of inductor, such as a coil of Litz wire, a PCB coil, or a printed coil. A wide range of resonant capacitors and resonant inductors can be utilized in the resonator circuit. For example, different combinations of inductors and capacitors that are rated for about 100 volts and about 2 amps of current with a low ESR can provide a desired output voltage commensurate with the power demands of a wide variety of consumer electronic devices, such as mobile telephones or batteries with integrated wireless receivers. Suffice it to say, essentially any combination of type and value of resonator inductor and resonator capacitor can be utilized that are appropriate for relaying wireless power to a secondary circuit.

As illustrated in FIG. 2, the control subcircuit can include an AC/DC converter and a switch. In the FIG. 2 embodiment, the AC/DC converter is a full bridge rectifier D1-D4 and the switch is a transistor Q1 with a pull-down resistor R1. Transistor Q1 may be a 7 A 100V 72 milliohm Rds N-channel logic level FET in a SC73 pkg—NXP BUK9875-100A,115. Resistor R1 may be a 100K ⅛ W 5% metal film resistor 1202 SMD—digikey PN P100ECT. In use, the resistor R1 may keep the transistor Q1 off if the feedback circuit (discussed below) is in an undefined state.

As illustrated in FIG. 2, the control subcircuit is connected to the resonator inductor L3 in parallel with the resonator capacitor C3. In one embodiment, the control subcircuit can be used to selectively shunt current around the capacitor C3. In one embodiment, the control subcircuit can be used to selectively provide a parallel resistance. For example, the transistor Q1 can be operated in the triode mode to selectively provide a variable resistance in parallel to the resonator capacitor C3. As another example, the control circuit can include a resistor in series with the transistor Q1. In the embodiment of FIG. 2, the rectifier may, among other things, facilitate use of a single low-cost transistor Q1 to shunt the resonator capacitor C3 or to provide a resistance parallel to the resonator capacitor C3. In other applications, the rectifier in the resonator circuit may be eliminated (See e.g. FIGS. 19 and 20).

In this embodiment, the resonator circuit is incorporated into a wireless receiver and is coupled to a secondary circuit. The design and configuration of the secondary circuit may vary from application to application. In the embodiment of FIG. 2, the secondary circuit generally includes a secondary inductor L4, an AC/DC converter, and a feedback circuit. Generally speaking, the secondary inductor L4 generates AC power when in the presence of a suitable electromagnetic field. The AC/DC converter converts the induced AC power into DC power. In the depicted embodiments, the AC/DC converter is a full bridge rectifier D5-D8, but the rectifier may vary from application to application as desired. For example, the full bridge rectifier may be replaced by a half-bridge rectifier (See e.g., FIG. 27). In application where the remote device is configured to receive AC power at the frequency generated by secondary inductor L4, an AC/DC converter may not be necessary. In some applications, it may be desirable to provide the secondary circuit with a resonant tank circuit. In such applications, a capacitor may be introduced in series or in parallel with the secondary inductor (See e.g. FIG. 27). In some applications, it may be desirable to include an identification capacitor in parallel with the secondary inductor L4. The value of the identification capacitor may be selected to provide a resonant response at the desired identification frequency, such as 1 MHz for remote devices intended to be compliant with the Qi® interoperable wireless power standard.

In this embodiment, the Q factor of the resonant circuit is adjusted based on feedback from the secondary circuit. In FIG. 2, the feedback circuit is an analog feedback circuit in the sense that it receives an analog signal from the secondary circuit. The output of the feedback circuit may be essentially digital (e.g. a signal that turns "on" or "off" the transistor) or it may be analog (e.g. a variable signal that can operate the transistor in the triode mode to cause transistor Q1 to appear as a variable resistor). In other embodiments, as will be discussed below, a different type of feedback circuit can replace or supplement the analog feedback circuit depicted in FIG. 2.

In this embodiment, the feedback circuit is configured to drive the control circuit based on the DC voltage in the secondary circuit. In this embodiment, the feedback circuit is coupled to the high-side of the power output of the secondary circuit on the DC side of the rectifier. The feedback circuit may be coupled to the secondary circuit in different locations based on the desired control factor (e.g. temperature, voltage, current or power). In some applications, the feedback circuit may be coupled to components outside the secondary circuit. For example, the feedback circuit may be coupled to a temperature sensor located adjacent to the battery of the remote device when battery temperature is the control factor. Although the temperature sensor may be part of the secondary circuit, it may alternatively be external to the secondary circuit. For example, the temperature sensor may be integrated into the circuitry of the remote device or it may be integrated directly into the resonant circuit.

In FIG. 2, the secondary circuit feedback is a function of a threshold voltage value set by the analog feedback circuit. More specifically, in the embodiment, the output of the feedback circuit is dependent on whether the voltage in the secondary circuit exceeds a threshold value. In other threshold-based analog feedback embodiments, the feedback can be a function of a temperature threshold, current threshold, power threshold or some other threshold. In the FIG. 2 embodiment, the analog feedback circuit includes a zener diode Z1 and a voltage detector U1. In alternative embodiments, the analog feedback circuit can include different components that generate a feedback signal. For example, the analog feedback circuit can include a comparator circuit, an op amp, or another circuit capable of producing a feedback signal. The feedback signal of the illustrated embodiment is either a high or low signal that closes the transistor Q1 when the voltage in the secondary circuit exceeds a threshold value. In other embodiments, the feedback circuit may be configured to produce a "high" output that operates the transistor at a specific point in the triode mode or linear region, thereby causing the transistor to effectively function as a resistor. The feedback circuit can be configured to provide a "high" output that corresponds with the signal required to cause the transistor to provide the desired resistance. In alternative embodiment, the feedback circuit can be configured to provide a variable output rather than a simple "high" or "low" output. In this embodiment, the output can be varied to open the transistor, close the transistor or operate the transistor Q1 at essentially any point in the triode mode. Operating the transistor in the triode mode allows the transistor to effectively function as a resistor. By providing a feedback signal that selectively varies, this alternative embodiment allows the transistor to effectively operate as a variable resistor. The transistor may be operated at different states depending on the control factor. For example, with a threshold control factor, the state of operation of the transistor may vary depending on how far the threshold value is exceeded. If the control factor exceeds the threshold by a relatively small amount, the transistor may be operated at a point in the triode mode where it presents relatively high resistance. If the control factor exceeds the threshold by a relatively large amount, the transistor may be fully closed or operated a point in triode mode where it presents relatively small resistance.

In the embodiment of FIG. 2, the characteristics of the zener diode and the voltage detector control the threshold value of the analog feedback circuit. In the current embodiment, Z1 is a 8.7V, 500 mW zener minimelf SMD pkg—Diodes, Inc. ZMM5238B-7 and U1 is a voltage detector chip with about a 4.6V threshold CMOS non-inverting output in a TO-92 pkg—Panasonic—SSG MN1381SUU. In operation, the U1 outputs a "low" signal when the output voltage does not exceed 4.6V or a "high" signal when the output voltage does exceed 4.6V. The threshold value can be varied by adjusting the characteristics of the zener diode and/or the voltage detector chip.

During operation, the control circuit operates to selectively reduce the Q factor (or Q value) of the resonator circuit when the output voltage in the secondary circuit exceeds the threshold voltage of 4.6V. More specifically, if the secondary output voltage is above the threshold, the control subcircuit configures the resonator circuit to lower the Q value of the resonator circuit, thereby reducing the amount of power relayed by the resonator circuit and effectively reducing the power received in the secondary circuit. If the secondary output voltage is below the threshold, the control subcircuit allows the resonator circuit to remain at maximum Q factor. In this embodiment, the control circuit is actuated by the feedback circuit, which provides a feedback loop from the secondary circuit. This feedback loop creates a cyclical control scheme in which the feedback circuit generates a "high" feedback signal when the secondary output voltage is over the threshold. In response, the control subcircuit closes transistor Q1 to reconfigure the resonator circuit to have a lower the Q value, which reduces the power relayed by the resonator and causes the secondary output voltage to decline. When the secondary output voltage falls below the threshold voltage, the feedback circuit will stop sending a "high" feedback to the control subcircuit. When the control subcircuit stops receiving a "high" feedback from the feedback circuit then the control subcircuit will open the transistor Q1, which allows the resonator circuit to revert to its original Q value. When the resonator circuit reverts to the original Q value, the secondary output voltage can again rise. If the secondary output voltage exceeds the threshold voltage, then the whole process begins again. In this way, the wireless receiver can actively adjust the Q value of the resonator circuit to prevent a certain output voltage from being exceeded.

In situations where the magnetic flux intercepted by the resonator circuit is sufficient for the resonator circuit at its original Q value to relay enough flux (e.g., relay power) to consistently exceed the threshold voltage, the control circuit may be rapidly engaging and disengaging the control circuit during operation. This active reconfiguration of the resonator can enable an average Q value over time. That is, by selectively configuring the resonator between a first configuration that provides a first Q value and a second configuration that provides a second Q value, an effective Q value between the first Q value and the second Q value can be provided. In one embodiment, the first configuration is an open circuit configuration and the second configuration is a shunt configuration. By actively reconfiguring between the open circuit configuration and the shunt configuration, the wireless receiver can selectively adjust the resonator circuit to control power relayed by the resonator circuit to the secondary inductor L4. In an alternative embodiment, one of the configurations can be a parallel resistance configuration.

During operation, secondary output voltage can change due to other factors besides the Q value of the resonator being reconfigured. For example, the load on the wireless receiver can change the number of remote devices in the electromagnetic field or the distance between the wireless receiver and the power source can change. The system can automatically account for these changes because the feedback is based on the secondary output voltage.

Although the switch of FIG. 2 is connected to the resonator inductor L3, the configuration of the switch may vary from application to application. For example, in the alternative embodiment illustrated in FIGS. 19 and 20, the control subcircuit can include a switch in series with the resonator capacitor C3 and the resonator inductor L3. In the FIGS. 19 and 20 embodiment, the switch includes two back-to-back field effect transistors with their gates tied together. A gate voltage above a threshold voltage configures the resonator circuit to an open circuit configuration and a gate voltage below the threshold voltage configures the resonator circuit to an isolated resonator circuit configuration. Although FIGS. 19 and 20 show the back-to-back transistors in series with the resonator capacitor and the resonator inductor, the back-to-back transistors could alternatively be connected to the resonator inductor in parallel with the resonator capacitor.

Figure 19:
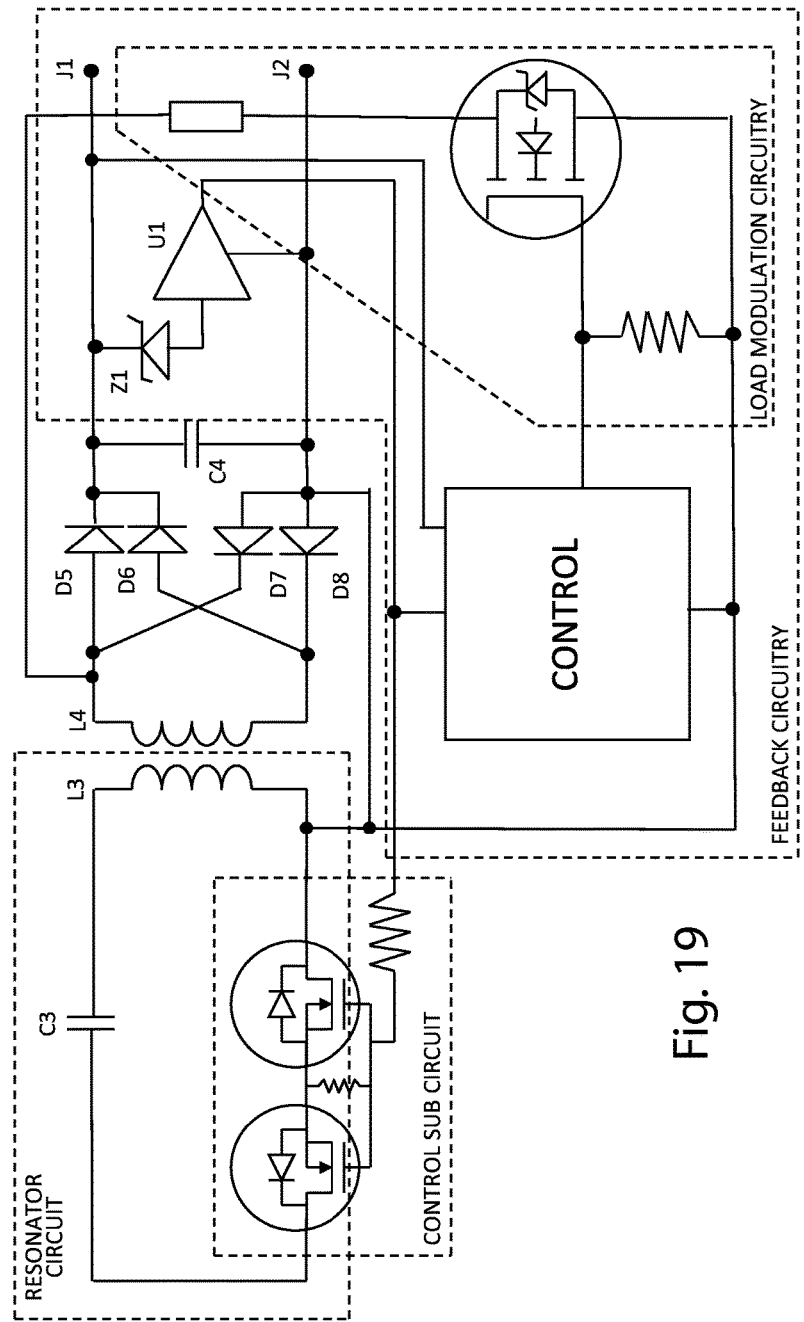
FIG. 19 is a representative schematic of a wireless receiver according to one embodiment configured with a control subcircuit having back-to-back field effect transistors.
Figure 20:
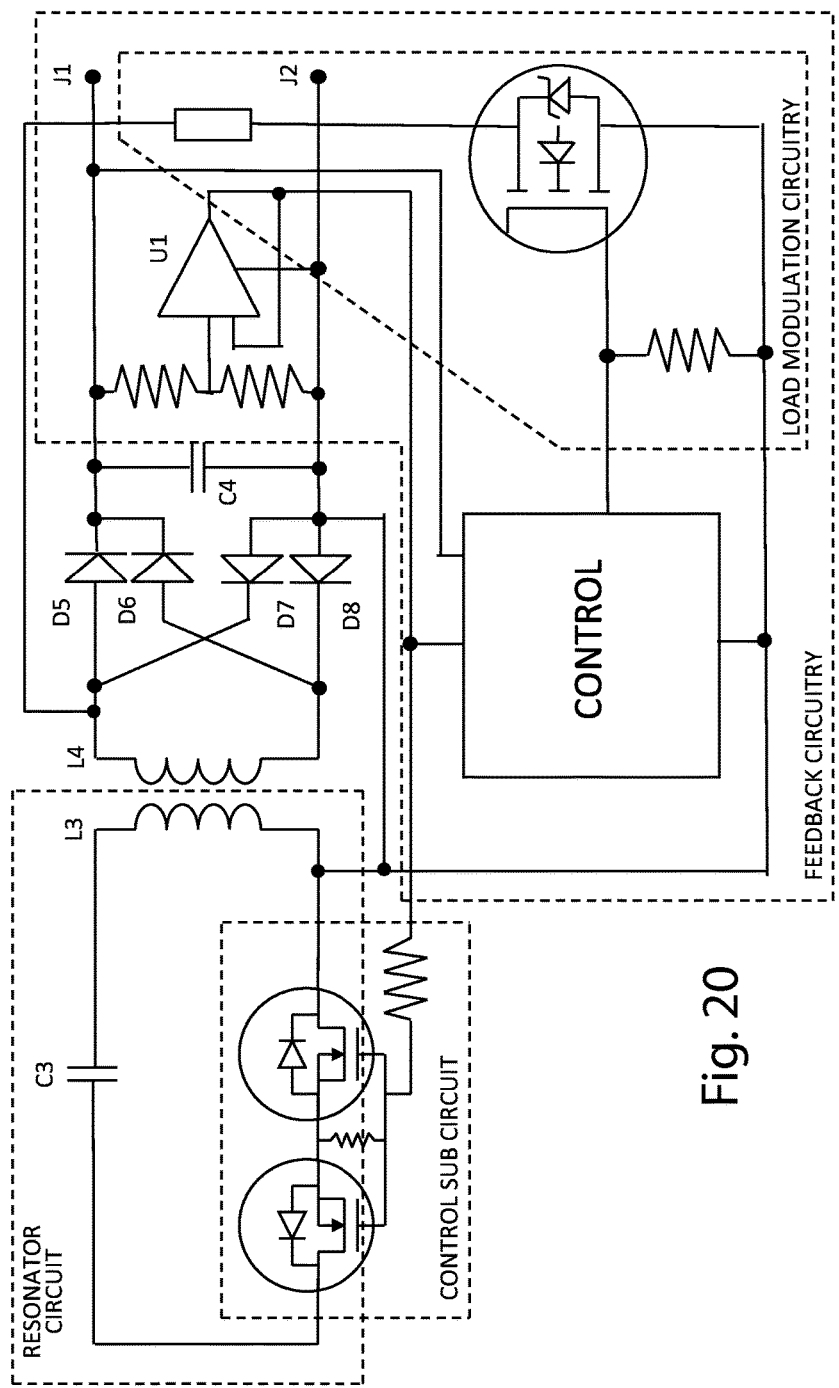
FIG. 20 is a representative schematic of a wireless receiver according to one embodiment configured with the control subcircuit having back-to-back field effect transistors and a variable resistance feedback.
Figure 21:
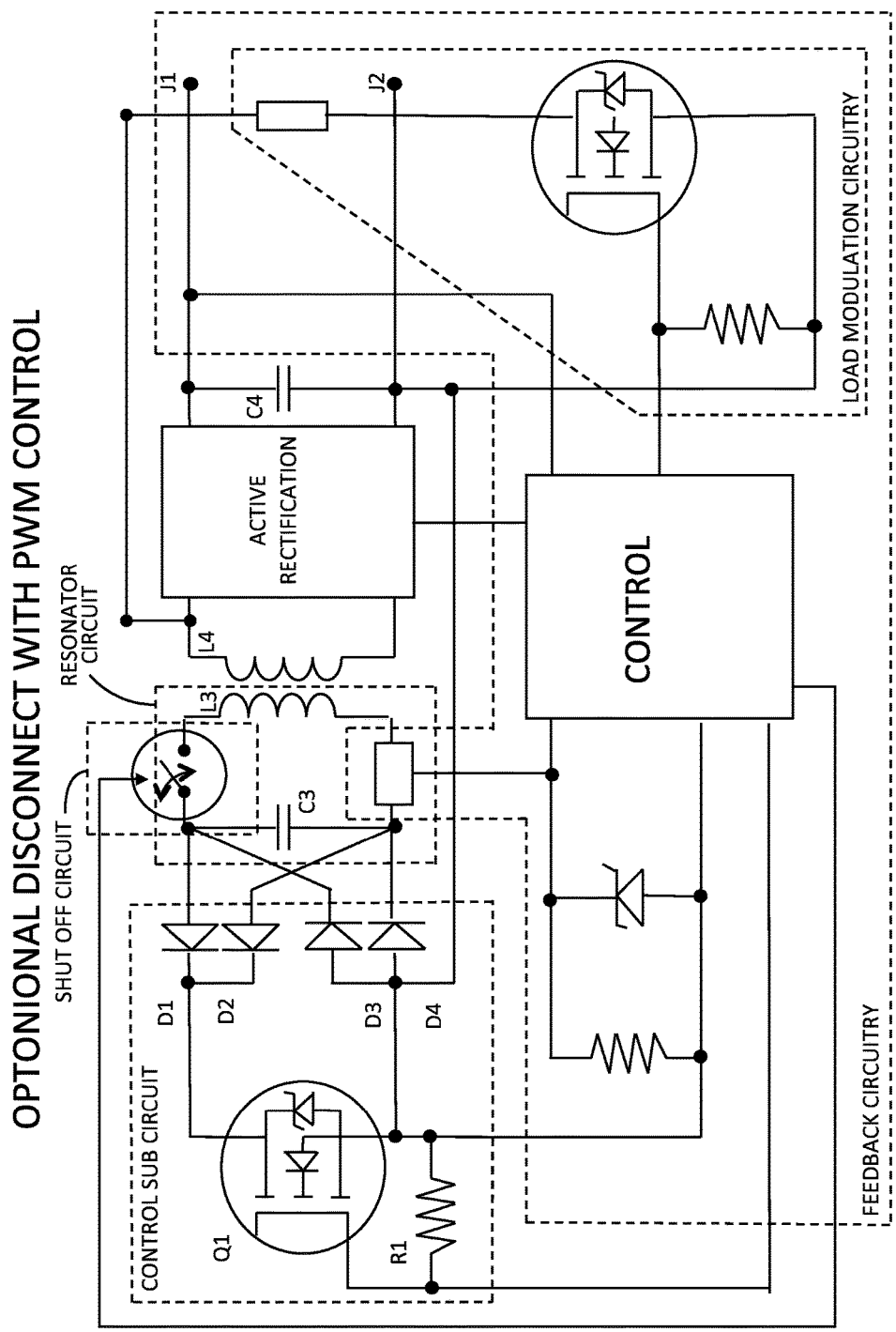
FIG. 21 is a representative schematic of a wireless receiver according to one embodiment configured with an optional disconnect.

In both the FIG. 2 and FIG. 19 embodiments, the control subcircuit can be operated to vary the Q factor of the resonator and, in effect, control the amount of power relayed through the resonators. In FIG. 2, when the transistor Q1 is inactive, the control subcircuit has a minimal effect on the Q factor of the resonator circuit. When the transistor Q1 is active, the control subcircuit has a dramatic effect on the Q factor of the resonator circuit. When the transistor Q1 operates in the triode mode, the Q factor is varied between the Q factors of the active and inactive configurations.

In FIG. 19, when the control subcircuit is in an open circuit configuration, the control subcircuit has a dramatic effect on the Q factor of the resonator circuit. For example, the Q factor of the resonator circuit with the control subcircuit in the open circuit configuration is about zero.

In both the FIG. 2 and FIG. 19 embodiments, the Q factor of the resonator can be adjusted by controlling the amount of time that the control subcircuit is in various configurations. For example, where there are multiple configurations with different Q factors or a time-averaged Q factor can be achieved by controlling the ratio of time that the control subcircuit is in each of the multiple configurations. The time-averaged Q factor may be directly proportional to the amount of time that the resonator is in each configuration. For example, in a resonator circuit where the time-averaged Q factor is linearly proportional, the Q factor in one configuration is 100 and the Q factor in another configuration is 0, a Q factor of 50 can be achieved by the control subcircuit being in one configuration about 50% of the time and in the other configuration about 50% of the time. A different Q factor can be achieved by changing the ratio. For example, in the linearly proportional application noted above, a Q factor of about 25 can be achieved by operating about 25% of the time in the configuration that provides a Q factor of 100 and about 75% of the time in the configuration that provides a Q factor of zero. In some embodiments, the system may control to a specific Q factor. For example, the Q factors of the different configurations of the resonator circuit may be predetermined, and the controller may be capable of actively reconfiguring the resonator circuit to achieve the desired Q factor or Q factor range. The period of changing the Q factor of the resonator can be adjusted proportionally to the amount of capacitance contained by the system. In applications with a minimum amount of capacitance, it may be desirable to increase the frequency at which the resonator is duty-cycled in order to minimize the voltage ripple in the system. For example, the frequency of the switching may be performed at the rate of the power transfer frequency, wherein the Q factor is adjusted for portions of a single period of the current in the resonator. For example, the Q factor may be increased for the first 20% of a single period of the current flowing in the resonator, and reduced for the remaining 80% of the period. In other applications, the system may control the Q factor based on additional or alternative factors, such as temperature, voltage, current or power. In these other applications, it is not necessary for the system to know the inductance, capacitance or Q factors of the resonator circuit in its various configurations.

In one embodiment, the control subcircuit includes a component capable of functioning as a variable resistor. The component may be a transistor operating in the triode mode or linear region. The feedback circuit may be capable of providing a proportional feedback signal to the control subcircuit that controls the value of the variable resistor. The feedback circuit may include a controller capable of adjusting the feedback signal relative based on an algorithm. The algorithm may vary the feedback signal based on the relative difference between the actual and desired values of the sensed characteristic. For example, the controller may utilize a control loop, such as a proportional, integral, derivative (PID) algorithm. In one embodiment, the duty cycle of the feedback signal may be proportional to the difference between the secondary output voltage and the threshold.

In the current embodiment, D1 through D8 may be 2 A 100V Fast Diodes—Diodes, inc B1100LB-13-F.

The filter capacitor C4 is optional. In some embodiments, additional filter components can be provided to filter the secondary circuit output. In the current embodiment the filter capacitor C4 provides about a 22 ms time constant for load presence re-detection. In one embodiment, C4—may be a 1 uf 50V ceramic X5R in a 1210 SMD pkg—Panasonic— ECG ECJ-4YB1H105K. In one embodiment, depending on the output voltage required, a 16 volt rated filter capacitor may be used.

Figure 3:
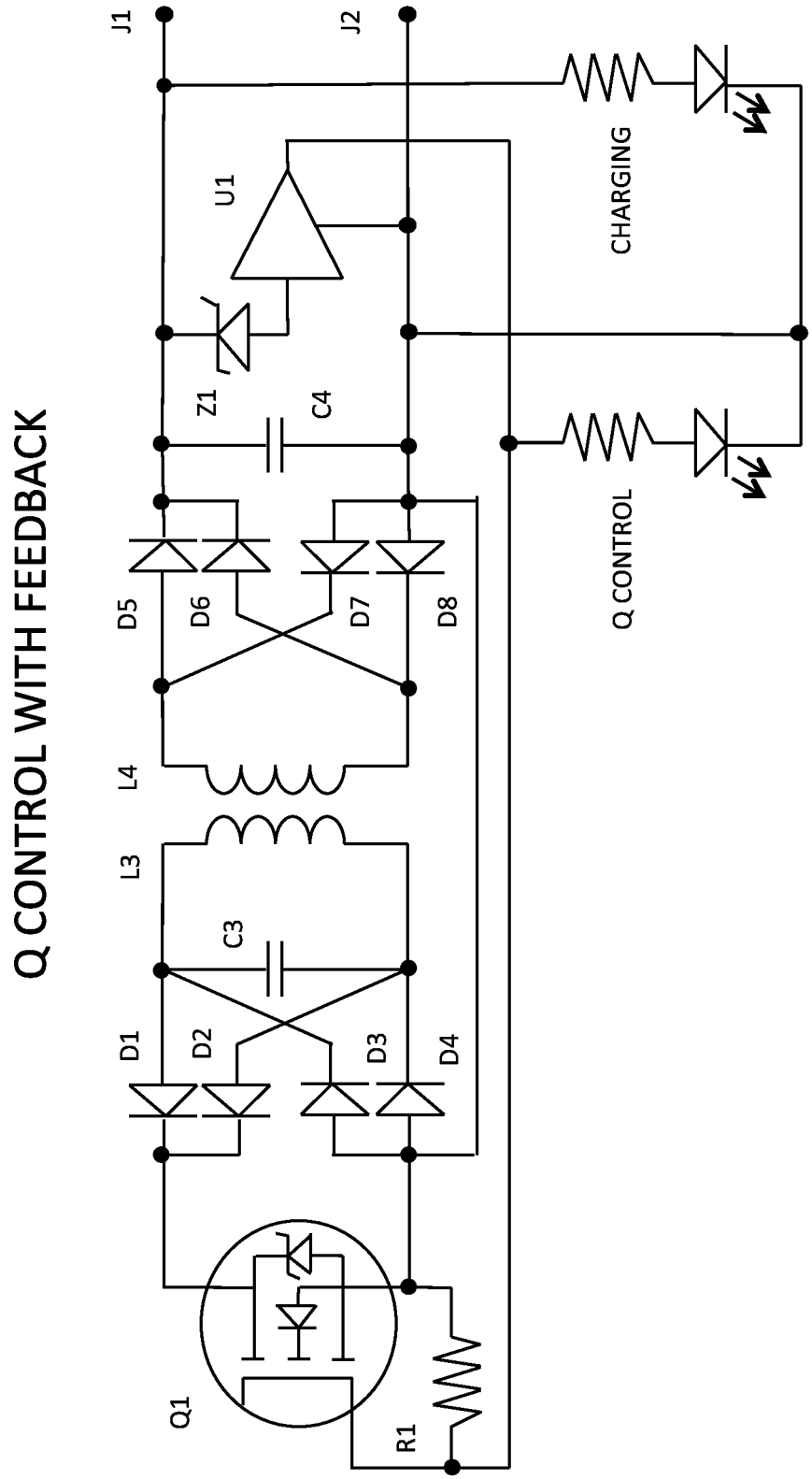
FIG. 3 is a representative schematic of the wireless receiver according to one embodiment configured with LED indicators.

One embodiment of the wireless receiver includes one or more indicators. Referring to FIG. 3, one embodiment includes an LED indicator for indicating when Q control is active and an LED indicator for indicating when charging is occurring.

Figure 4:
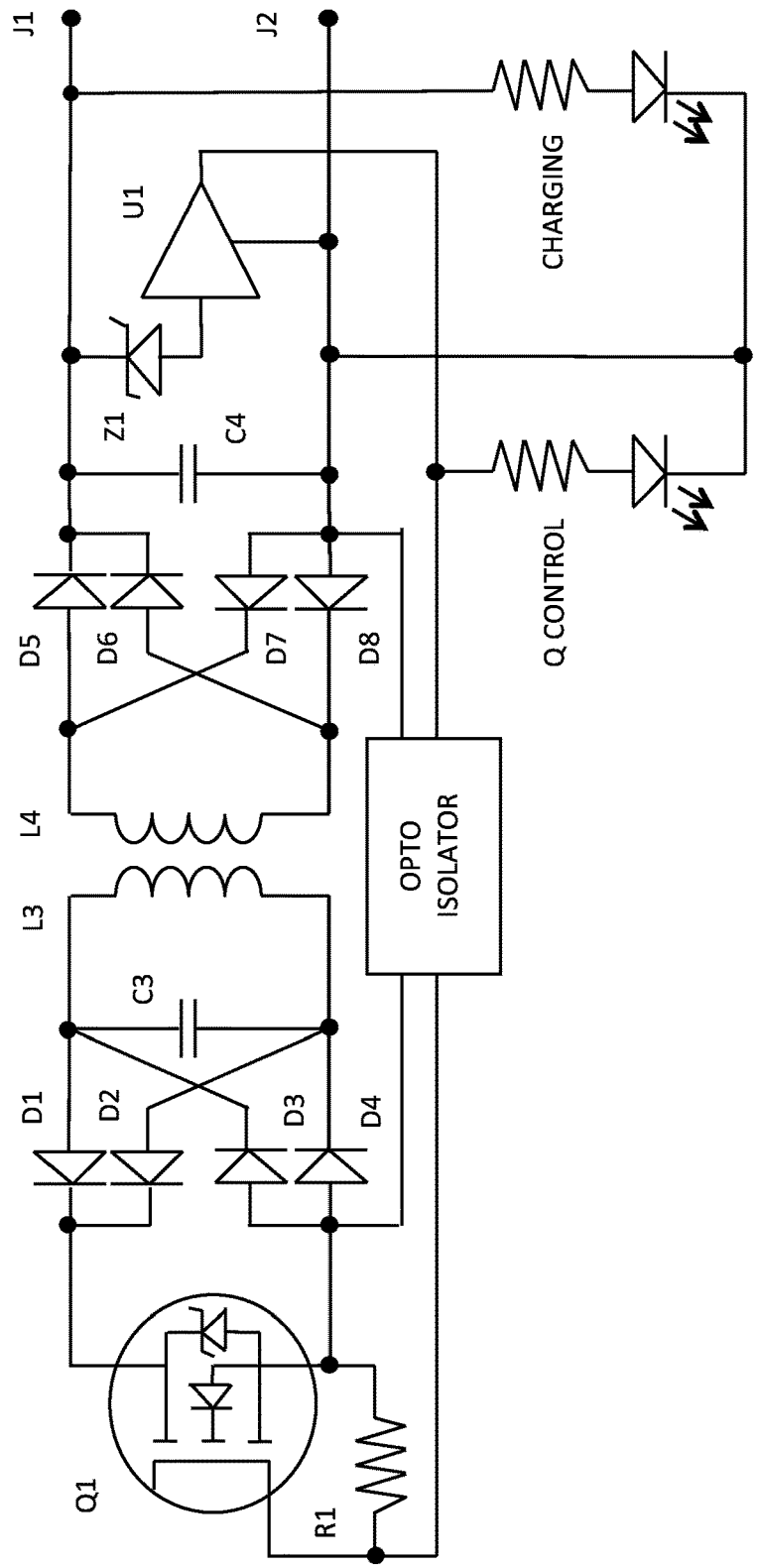
FIG. 4 is a representative schematic of a wireless receiver according to one embodiment having LED indicators and optically isolated feedback circuitry.
Figure 24:
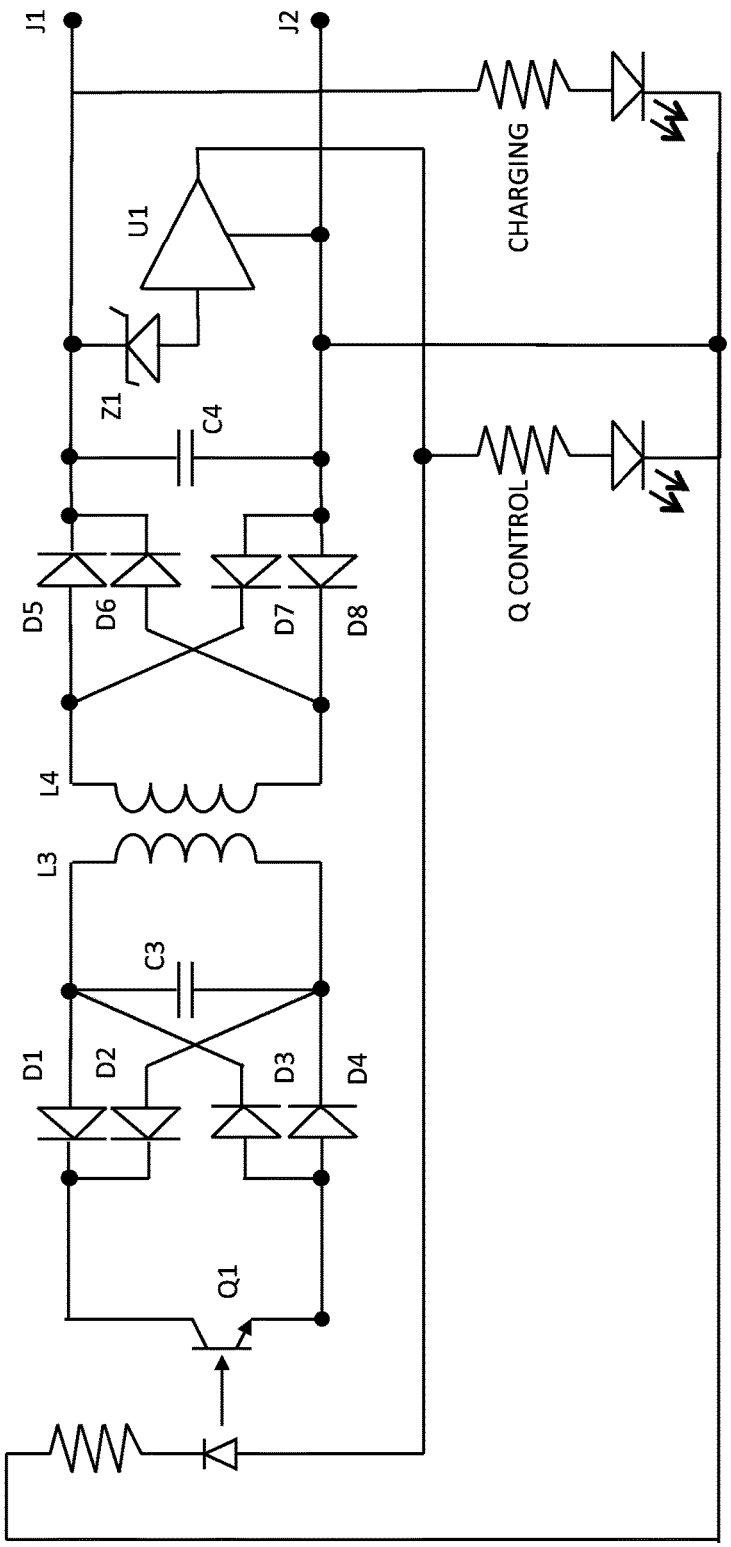
FIG. 24 is a representative schematic of a wireless receiver according to one embodiment and configured with optically isolated feedback circuitry.

One embodiment of the wireless receiver includes an opto-isolator that isolates the resonator circuit and the control subcircuit from the secondary circuit. Referring to FIG. 4, a representative schematic of the wireless receiver having LED indicators and optically isolated feedback circuitry is illustrated. The opto-isolator can assist in preventing high voltages or rapidly changing voltages on one side from damaging components or distorting signals on the other side. One embodiment including an opto-isolator is illustrated in FIG. 24.

Turning now to the illustrated embodiments of FIGS. 5-9 and 19-22, an embodiment of a wireless receiver may be similar to the embodiments described above, with several exceptions. The feedback circuitry of the FIGS. 5-9 and 19-22 embodiments includes a controller configured to provide feedback to the resonator circuit in order to control power relayed by the resonator. As with other embodiments, the feedback circuitry may provide control signals to actively control the control subcircuit. The feedback circuitry may include a field effect transistor as illustrated in the FIGS. 2-9 embodiments or include two back-to-back field effect transistors as illustrated in the FIGS. 19 and 20 embodiments. In FIG. 19 the feedback circuit may be configured to provide a high or low output that switches the control subcircuit between alternative states. In FIG. 20, the feedback circuitry includes an operational amplifier that provides proportional control of the control subcircuit. For example, the feedback circuit may have an analog output to allow the back-to-back transistors to function as a variable resistance. In FIGS. 19 and 20, the wireless receiver may include a controller that may monitor the output of the feedback circuit, the output of the secondary circuit, or both. Furthermore, the controller can communicate as described elsewhere herein.

Figure 22:
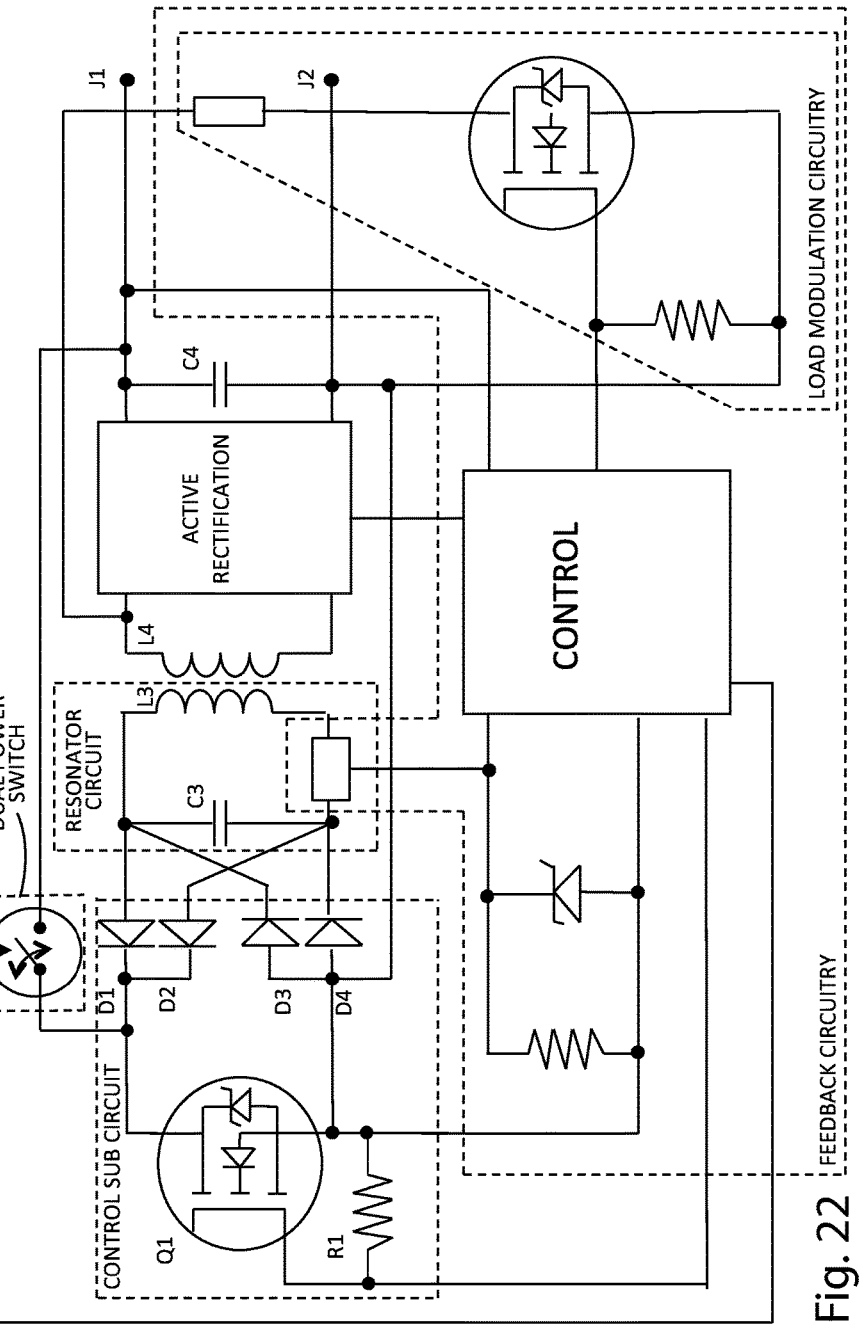
FIG. 22 is a representative schematic of a wireless receiver according to one embodiment configured to optionally couple the resonator circuit and the primary circuit to a receiver output.

In one embodiment, as illustrated in FIG. 22, the controller can select a dual-coil power receiving mode in which the DC output from the resonator circuit and the active rectification circuitry may be coupled together using a switch. With this configuration, if the controller determines that the resonator and primary coils are closely coupled to the inductive power supply, then the controller may configure the wireless receiver, by closing a dual power switch, to use power from both the resonator inductor L3 and the secondary inductor L4.

Figure 5:
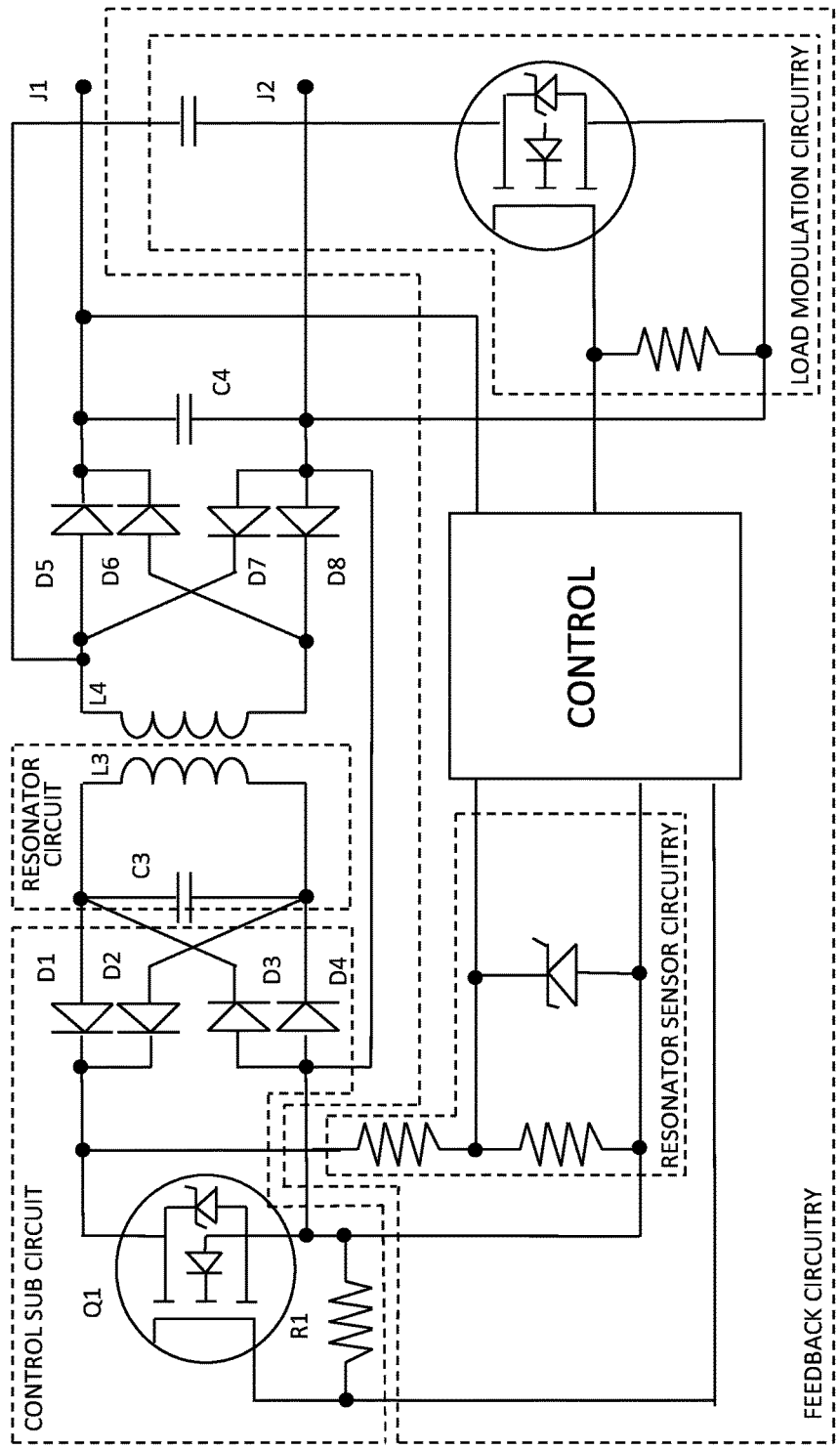
FIG. 5 is a representative schematic of a wireless receiver having digital feedback circuitry according to one embodiment being configured with a capacitive element for load modulation.
Figure 6:
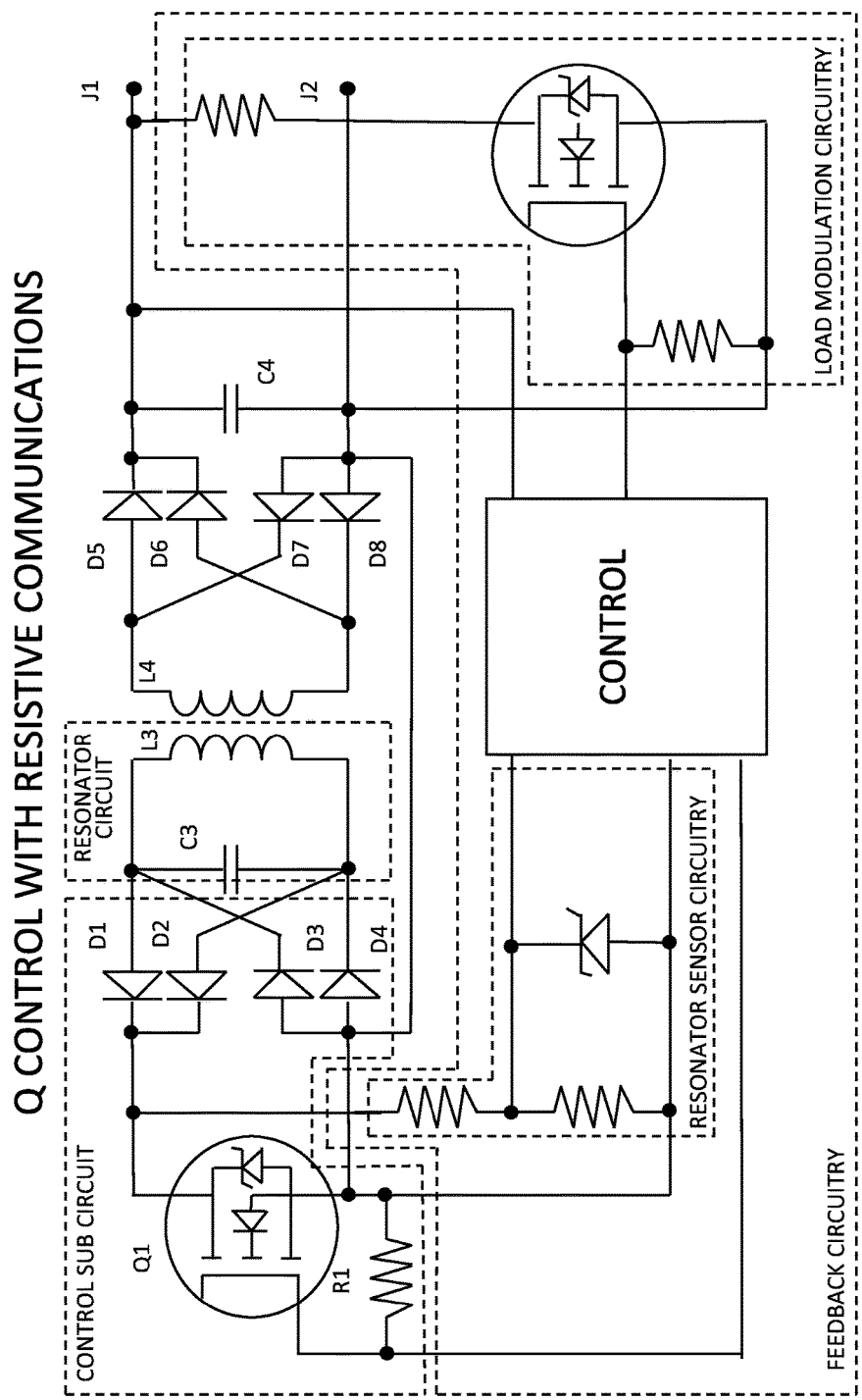
FIG. 6 is a representative schematic of the wireless receiver according to one embodiment configured with a resistive element for load modulation.

In the illustrated embodiment of FIG. 5, the controller of the feedback circuitry incorporates a sensor adapted to sense information about the output of the secondary circuit. In alternative embodiments, the sensor may be a separate component from the controller. As mentioned above, the sensed information may include at least one of voltage, current, temperature, and a characteristic of power. In the illustrated embodiment, the controller may provide feedback to the resonator circuit based on the voltage sensed at an output of the secondary circuit, for example J1. For example, similar to other embodiments, the controller may control the control subcircuit to selectively shunt or selectively provide a parallel resistance to the resonator circuit in response to the sensed voltage reaching a threshold. In this way, the controller may actively control the Q factor of the resonator circuit by selecting one Q factor for a first duration and another Q factor for another duration, thereby resulting in a time-averaged Q factor depending on the relative time of the first duration with respect to the second duration.

In one embodiment, the controller may actively control the Q factor of the resonator circuit by selecting one Q factor for part of a cycle and another Q factor for another part of the cycle. For example, the system can use a shunt load on the high Q resonator circuit L3, C3 to convert it from a high Q resonator to a low Q resonator, such as any of the circuits shown in FIGS. 2-9. When shunted, the low Q resonator may still resonate some field into the receiver L4, however little energy is lost in the shunt due to the reduced current present in L3. The shunting of L3 can be done for several cycles of the recirculating current in L3, or can be done on a cycle by cycle basis where the shunt is duty-cycled, or applied for a percentage of each period. Additionally, the timing of the shunt may be performed anytime during the cycle. In one embodiment where the shunt is applied once or twice per cycle, the timing may correspond to a zero crossing of the current waveform of the power received in the resonator circuit L3/C3. For example, the shunt may be remain off or deactivated after each zero crossing for percentage or duration of the cycle, and then activate for the remainder of the cycle. As another example, the shunt may be activated at the zero crossing for a percentage or duration of the cycle, and then deactivate for the remainder of the cycle. If the shunt is controlled on a cycle-by-cycle basis, the voltage received by L4 cycles at a higher frequency, allowing for a smaller bulk capacitor to filter out ripple voltage. By adjusting the duty cycle of the resonator between high Q and low Q states, the receiver can adjust the amount of current in L3, thereby adjusting the amount of power received in L4. For example, when the remote device is placed on a transmitter with a higher amount of coupling, the current in the L3 resonator increases during the high Q state. To compensate for the increase and prevent over-voltaging the receiver, the duty cycle of the shunt can be increased, increasing the duty cycle of the low Q state to reduce the overall power received by the remote device.

A model of a system that cycles between Q factors during operation is now described with reference to FIGS. 35 and 36. Specifically, an analysis and simulation of a four coil system (in other words, a two coil receiver circuit and a two coil transmitter circuit) according to one embodiment of the present invention is described.

Figure 35:
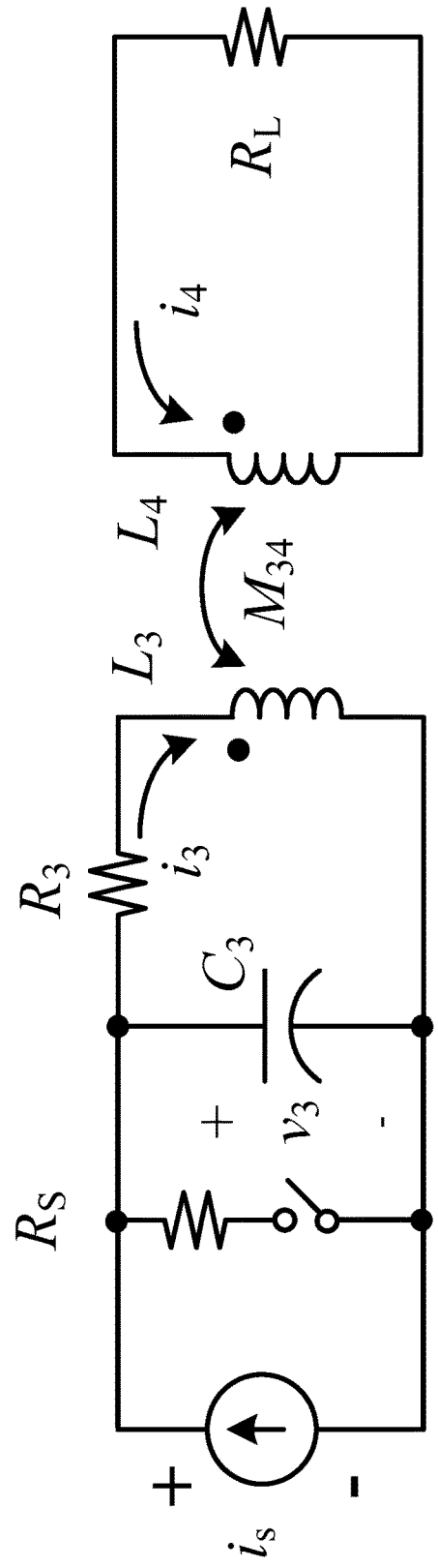
FIG. 35 shows a circuit topology of a receiver-side wireless power transfer network.
Figure 36:
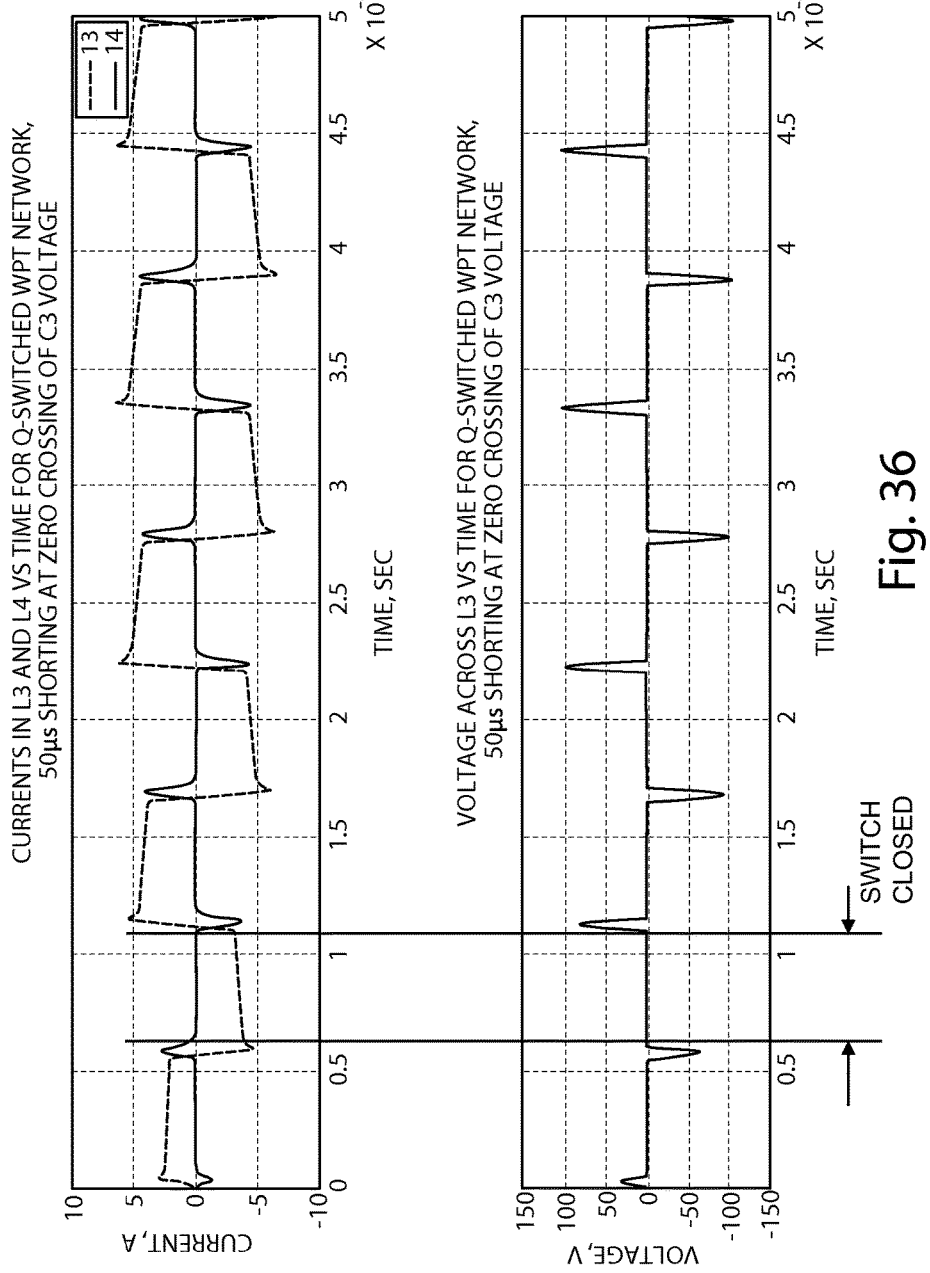
FIG. 36 shows graphs of current and voltage of a circuit analysis of the receiver-side wireless power transfer network.

Referring to FIG. 35, the receiver side of the four coil wireless power transfer network for this analysis is shown. It includes a resistance $R_s$ that may be switched across the $L_3$-$C_3$ tank circuit. In this circuit, $R_3$ is the equivalent series resistance (ESR) of inductor $L_3$, and capacitor $C_3$ is assumed to be lossless. The ESR of $L_4$ may be considered to be a part of the total load $R_L$.

To simplify the analysis, the time-varying flux from the transmitter side of the wireless-power-transfer (WPT) network has been simulated in FIG. 35 by a current source $i_s$. (This assumption may be valid if the flux-coupling coefficient is small between the transmitter-side resonator and the receiver-side resonator).

The state equations of the WPT network are as follows:

$$\begin{bmatrix} \frac{di_3}{dt} \\ \frac{di_4}{dt} \\ \frac{dv_3}{dt} \end{bmatrix} = \begin{bmatrix} \frac{-R_3 L_4}{L_3 L_4 - M_{34}^2} & \frac{R_L M_{34}}{L_3 L_4 - M_{34}^2} & \frac{L_4}{L_3 L_4 - M_{34}^2} \\ \frac{R_3 M_{34}}{L_3 L_4 - M_{34}^2} & \frac{-R_L L_3}{L_3 L_4 - M_{34}^2} & \frac{-M_{34}}{L_3 L_4 - M_{34}^2} \\ \frac{-1}{C_3} & 0 & \frac{-1}{R_s C_3} \end{bmatrix} \times \begin{bmatrix} i_3 \\ i_4 \\ v_3 \end{bmatrix} + \begin{bmatrix} 0 \\ 0 \\ \frac{1}{C_3} \end{bmatrix} i_s$$

The state equations are expressed in the form (dX/dt) =AX+BU where X is a column vector of system states, A is the state-transition matrix, and B is a weighting matrix for the input vector U. In this case, there is one stimulus that drives the system, and U is a scalar $i_s$. The system states are the current $i_3$ in inductor $L_3$, current $i_4$ in inductor $L_4$, and voltage $v_3$ across capacitor $C_3$.

When the switch of the circuit shown in FIG. 35 is open, the effective value of $R_s$ becomes infinite, and A (3,3) becomes 0. The waveforms shown in FIG. 36 were obtained by solving the state equations for the following parameters:

$L_3$=33.3 µH; $L_4$=12.1 µH; $M_{34}$=10.67 µH; $C_3$=91.39 nF; $R_3$=0.083Ω; $R_s$=0.05Ω;

$i_s$=2 sin(2π×100 kHz t), where t is time in s.

The value of the source current was determined to be that which produced a circulating current of 11.5 A peak in $L_3$-$C_3$ under sinusoidal, steady-state excitation conditions with a time-invariant network (i.e., $R_s$=∞).

The shorting strategy in FIG. 35 was to switch $R_s$ across $C_3$ at each zero crossing of $v_3$ and to leave it in place for 50 µs. Simulations from start-up (all initial conditions zero) for the Q-switched network of FIG. 35 are shown in FIG. 36 using a strategy of applying $R_s$ in parallel with $C_3$ at the instant of zero-crossing of the voltage $v_3$ and asserting this connection for a duration of 50 µs. At the end of this period, the switch was opened. It can be readily seen that current $i_4$ drops rapidly to zero when $R_s$ is asserted. The feedback circuit may also include resonator sensor circuitry adapted to sense information about the resonator circuit or the control subcircuit, including at least one of voltage, current, temperature, or a characteristic of power, for example. In the illustrated embodiment of FIG. 5, the resonator sensor circuitry is configured to sense voltage, and includes a voltage divider and a Zener diode. The voltage divider may provide an output, which is proportional to the voltage in the resonator circuit, to the controller. The Zener diode may protect the controller from output voltages that exceed the input voltage threshold of the controller. In the illustrated embodiment of FIG. 8, the resonator sensor circuitry is configured to sense current using a current transformer T1, whose output to the controller may be a voltage proportional to the current through the resonator circuit.

Based on sensed information from the resonator sensor circuitry, the controller may control the control subcircuit in order to control power relayed by the resonator circuit in response to the sensed information from the resonator sensor circuitry being above a threshold despite the sensed information about the output of the secondary circuit being below a threshold. In alternative embodiments, the controller may enable a shut off circuit in order to effectively eliminate the resonator circuit from the receiver circuit based on sensed information from the resonator sensor circuitry. The illustrated embodiment of FIG. 21 includes a shut off circuit that in response to being switched to an off state, may effectively eliminate the resonator circuit from the receiver circuit. As an example, the controller may enable the shut off circuit based on an indication that power levels in the resonator circuit remain high despite attempts to reduce the output power of the secondary circuit by controlling the control subcircuit.

Returning to the illustrated embodiment of FIG. 5, the feedback circuit may include load modulation circuitry configured to communicate information to an inductive power supply via the inductive coupling between the receiver circuit and the inductive power supply. The load modulation circuitry may include an impedance element, such as a capacitive element, a resistive element, an inductive element, or a combination thereof, that may be selectively modulated to transmit information. For example, the impedance element is a capacitor in the illustrated embodiment of FIG. 5, and is a resistor in the illustrated embodiment of FIG. 6.

Modulating the impedance element changes the reflected impedance through the inductive coupling between the receiver circuit and the inductive power supply, which the inductive power supply may sense in order to demodulate information. In this way, information may be transmitted using modulation or backscatter modulation, including amplitude modulation, frequency modulation, and phase modulation. For purposes of disclosure, information may be transmitted to the inductive power supply using feedback circuitry, but other circuit topologies may be used to communicate information such as those described in U.S. Pat. No. 7,522,878, which is entitled "Adaptive Inductive Power Supply with Communication" and issued Apr. 21, 2009 to Baarman—which is incorporated herein by reference in its entirety. Other communication systems, such as standalone receivers and transmitters—e.g., Bluetooth—may also be used to communicate information.

Figure 7:
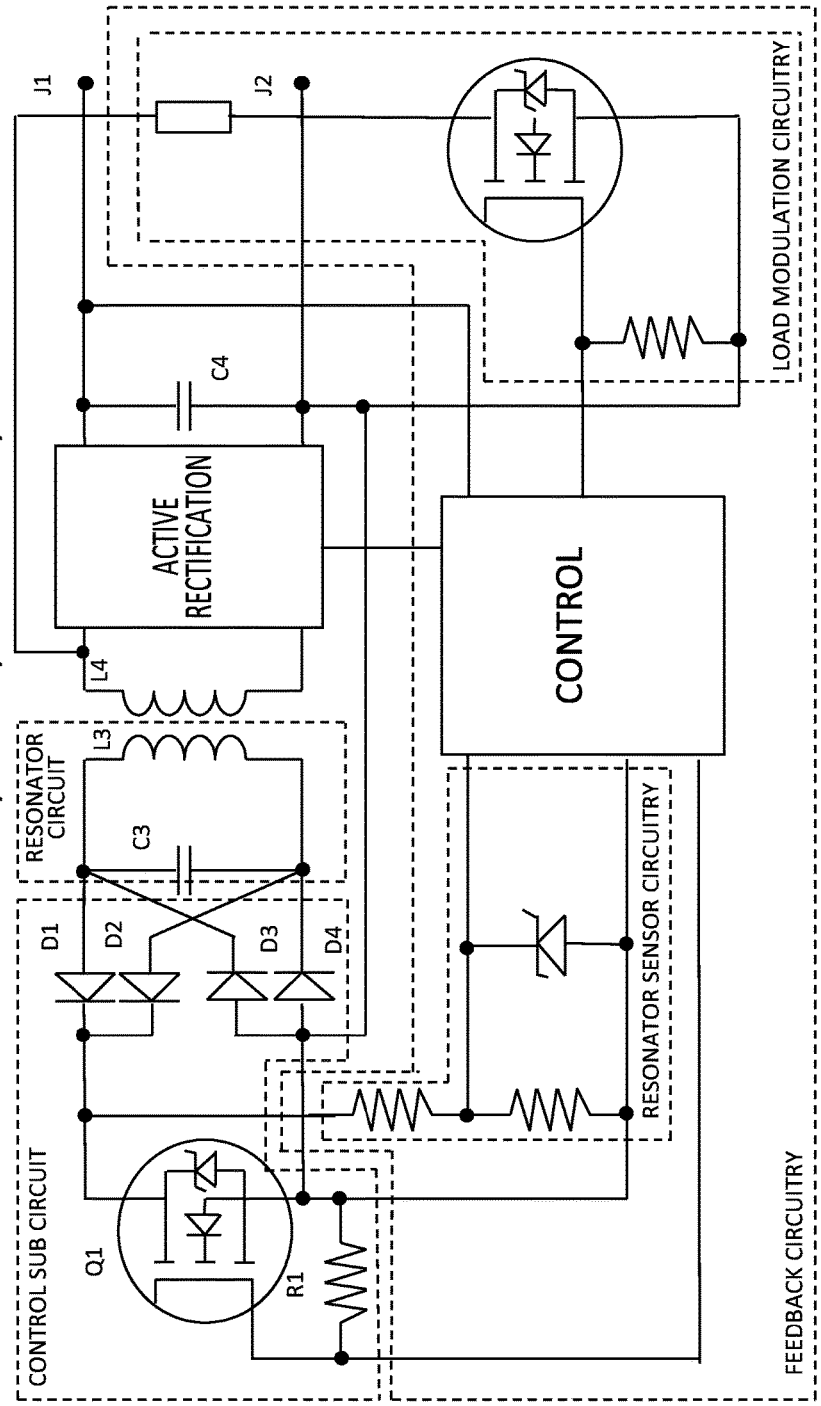
FIG. 7 is a representative schematic of the wireless receiver according to one embodiment configured with active rectification circuitry.
Figure 8:
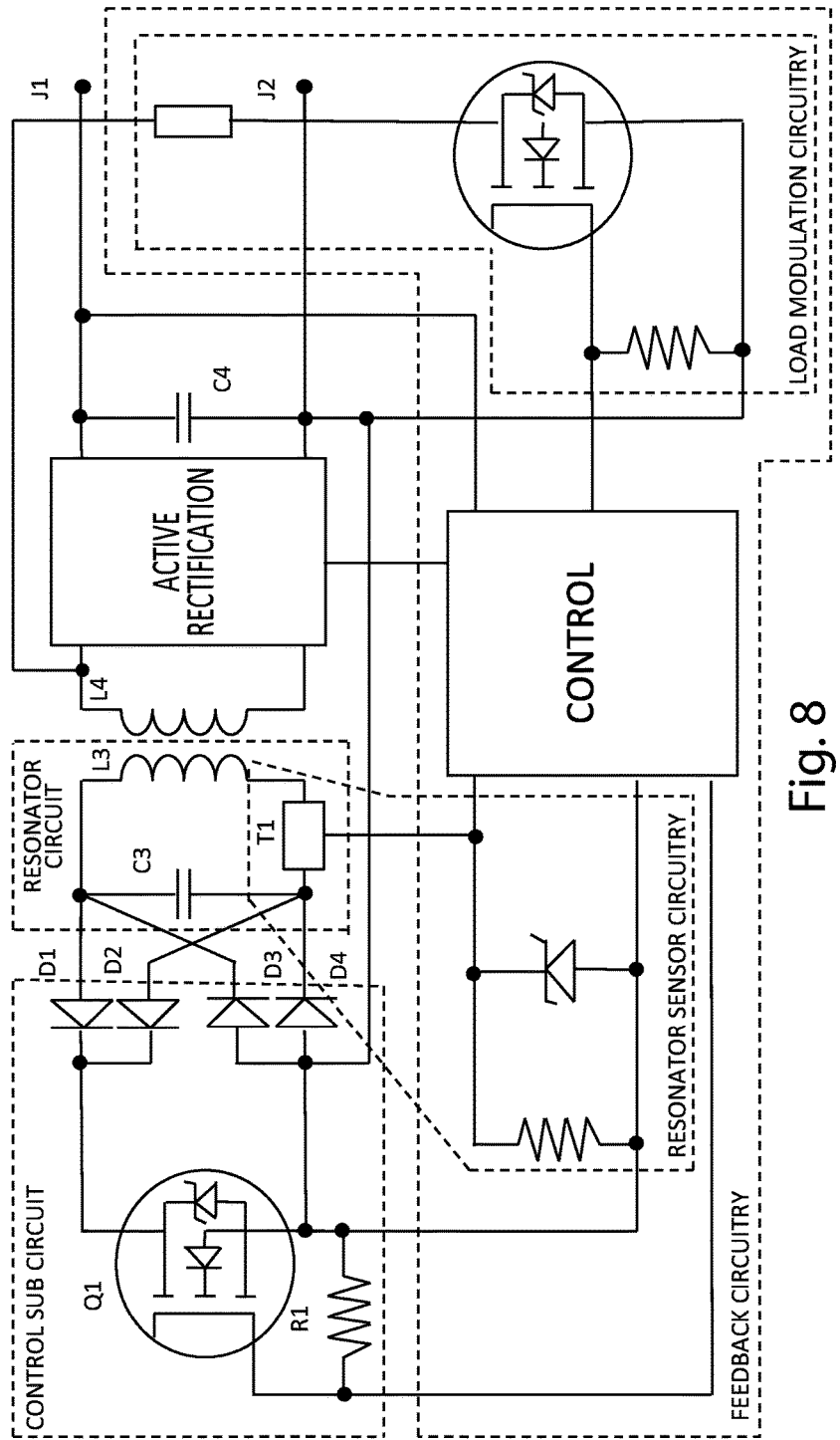
FIG. 8 is a representative schematic of the wireless receiver according to one embodiment configured with active rectification circuitry and a current sense transformer coupled to a resonator circuit.

As shown in the illustrated embodiments of FIGS. 7 and 8, the receiver circuit may also include communication circuitry configured to transmit information to the inductive power supply using keyed modulation to encode fixed frequency communications on a variable frequency power transmission signal. In other words, the number of modulations associated with each bit may be dynamically varied as a function of the ratio of the communication frequency to the carrier signal frequency. For purposes of disclosure, information may be transmitted to the inductive power supply using communication circuitry, but other communication circuits may be used to communicate information such as those described in U.S. Ser. No. 61/564,130, filed Nov. 28, 2011 and entitled "SYSTEM AND METHOD FOR PROVIDING COMMUNICATIONS IN A WIRELESS POWER TRANSFER SYSTEM", to Norconk et al.—which is incorporated herein by reference in its entirety. Although two circuits for communicating information are shown in the illustrated embodiments of FIGS. 7 and 8, it should be appreciated that the receiver circuit may include load modulation circuitry without communication circuitry, or communication circuitry without load modulation circuitry. Both may also be present, as illustrated, in order to provide the receiver circuit with multiple available communication systems.

Figure 9:
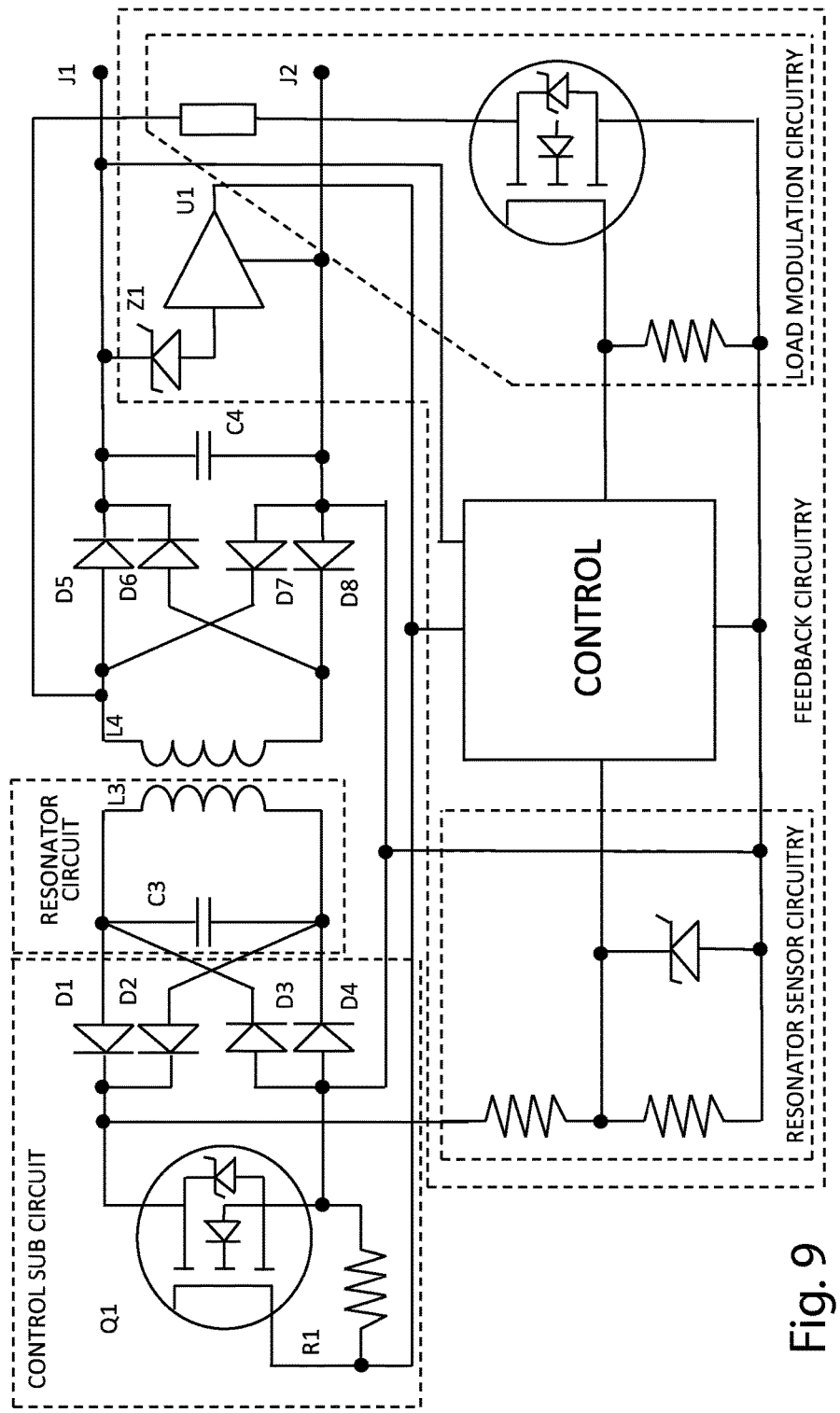
FIG. 9 is a representative schematic of one embodiment of the wireless receiver including digital feedback circuitry to supplement analog feedback circuitry.

The feedback circuitry, in some embodiments, may include both a controller and analog feedback circuitry to control power related by the resonator. For example, as illustrated in FIG. 9, the controller may monitor the resonator circuit via resonator sensor circuitry and communicate to an inductive power supply via load modulation circuitry, and the analog feedback circuitry may provide feedback to the control sub-circuit as described with respect to FIG. 2 above.

Figure 28:
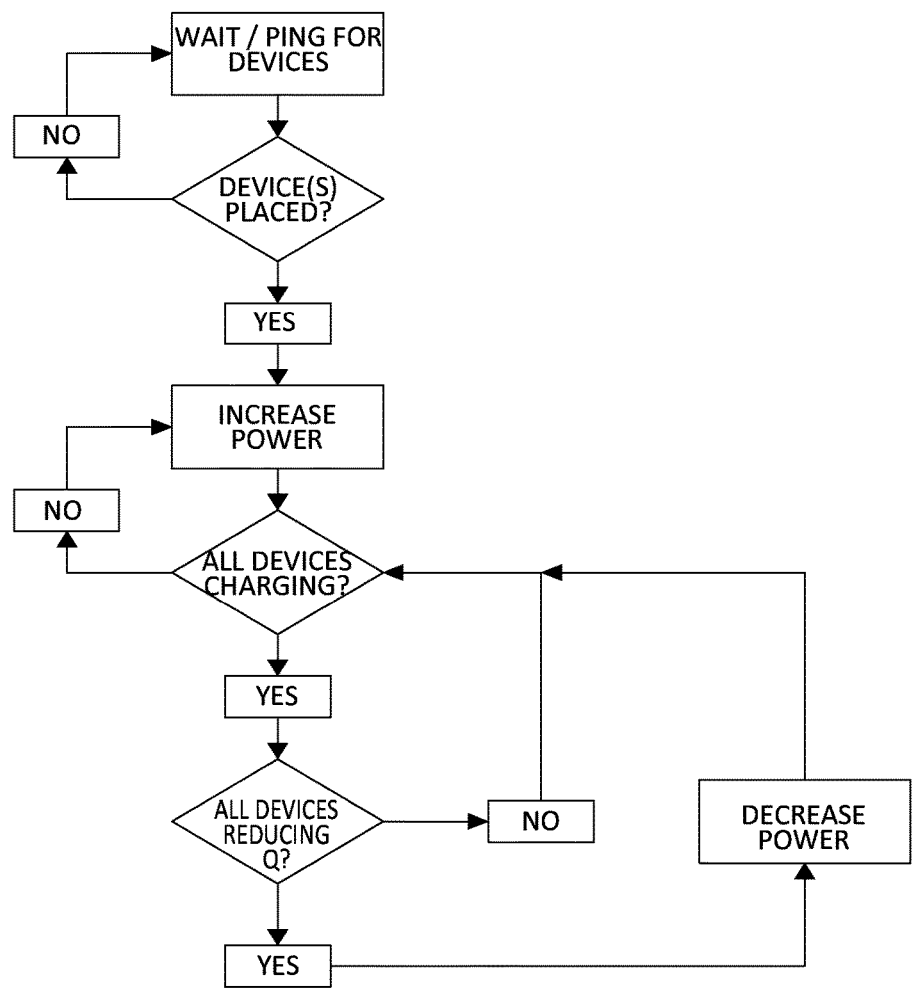
FIG. 28 is a representative flow diagram of a control method for a mid-range transmitter.

Referring to FIG. 28, one embodiment for a control method for a mid range wireless transmitter is illustrated. The transmitter can be programmed to wait for a device to be placed on or near the power transfer surface. In one embodiment, the transmitter periodically pings to recognize whether a device has been placed. For example, the wireless transmitter can periodically energize an inductor and analyze the reflected impedance to identify changes in impedance that occur from a wireless receiver being paced in proximity of the power transfer surface. In one embodiment, the transmitter ping can be supplemented by or replaced by a wireless receiver initiated communication.

In response to detecting a device, the mid range power transmitter can increase its power level. For example, the mid range power transmitter can increase the Q value of its resonator if one is included, or it can increase the rail voltage to increase the amount of power being transmitted. The mid range transmitter can determine whether all of the devices that are present are charging. If a determination is made that all of the devices are not charging, then the power can be increased iteratively until sufficient power is being provided to charge all of the devices. In one embodiment, one way to determine if all of the devices are charging is via communication with the devices.

In one embodiment, the mid range wireless power transmitter can determine whether all of the wireless receivers in proximity are reducing their Q factor. For example, each of the wireless receivers can be programmed to communicate to the mid range wireless transmitter that they are receiving too much power and are reducing their Q factor. Optionally, each wireless receiver can report its Q factor to the transmitter. In response to a determination that all of the wireless receivers in proximity are reducing their Q factor, the wireless transmitter can decrease the amount of power being wirelessly transmitted. In one embodiment, the wireless transmitter can iteratively reduce the amount of power being wirelessly transmitted until one of the wireless receivers reports that it is not reducing its Q factor. In one embodiment, the mid range wireless power transmitter can intelligently reduce the amount of power based on the reported Q factors to a level where at least one wireless receiver will not be reducing its Q factor. In this way, a plurality of wireless receivers can be simultaneously charged at a level that provides efficient charging for multiple wireless receivers without providing excess energy.

Although the current embodiment describes a control method where at least one device is not reducing its Q factor, in alternative embodiments the control method may include iteratively reducing power until a threshold of wireless receivers are not reducing their Q factor. In this way, the controller can intelligently decide the appropriate amount of energy to transfer that balances efficiently transferring power and ensuring that the wireless receivers have sufficient energy to charge.

Figure 29:
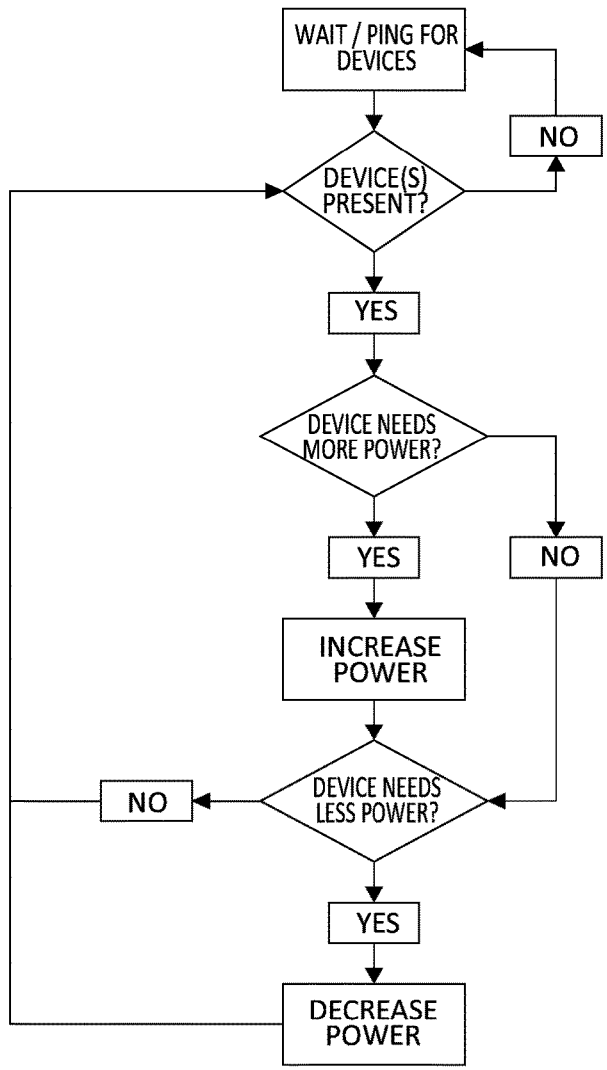
FIG. 29 is a representative flow diagram of control method for a close coupled transmitter compatible with a Q control wireless receiver.

Referring to FIG. 29, one embodiment for a control method for a close coupled transmitter is illustrated. The transmitter can be programmed to wait for one or more wireless receivers to be placed in proximity of the power transfer surface. As with FIG. 28, the transmitter can periodically ping to recognize whether a device has been placed, the wireless receivers can report presence, or some other method of recognizing presence can be utilized. A wireless receiver can indicate that it needs additional power, for example by communicating with the transmitter and the transmitter can respond by increasing the output power. A wireless receiver can also indicate that it needs less power, in which the wireless power transmitter decreases the power being transmitted. The close coupled transmitter method can be used in connection with wireless receivers that have Q control. The close coupled transmitter control methodology may not be affected by wireless receivers that have Q control. That is, wireless receivers with Q control can act on their own to vary the Q factor of the resonator appropriately, as will be described in connection with FIG. 30. In this way, wireless receivers with Q control can be compatible with both close coupled transmitters and mid-range wireless transmitters.

Figure 30:
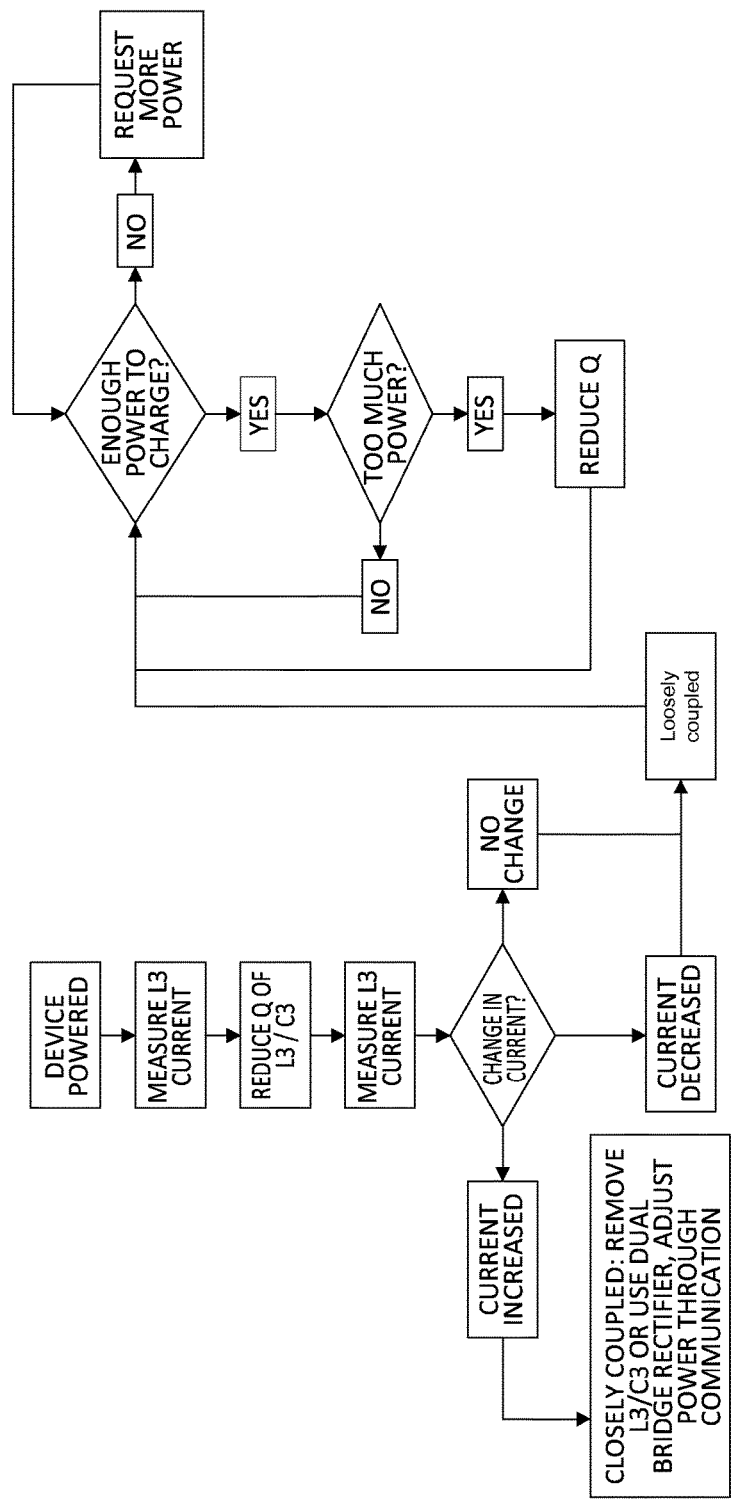
FIG. 30 is a representative flow diagram of a wireless receiver having Q factor control.

Referring to FIG. 30, one method of control for Q control of a wireless receiver is illustrated. In response to receiving wireless power from a wireless transmitter, the wireless receiver measures the current, voltage, or some other characteristic in the resonator. The wireless receiver can have a process to determine whether the wireless power transmitter sending power is a closely coupled transmitter. In the current embodiment, the current in the resonator inductor L3 is measured, the Q factor of the resonator is reduced, and then the current in the resonator inductor L3 is measured again while the Q factor is reduced.

If current increasing when the Q factor is reduced, the wireless receive is likely receiving energy from a closely coupled transmitter. Accordingly, the resonator circuit can be switched out of the wireless receiver and power can be adjusted through communication with the wireless power transmitter. In one embodiment, the dual bridge rectifier configuration of FIG. 22 can be utilized in response to determining that the wireless power transmitter is closely coupled.

If the current decreases or does not change, then the wireless receiver is likely receiving wireless power from a loosely coupled wireless power transmitter, such as a mid range wireless power transmitter. The wireless receiver determines whether there is sufficient power to charge. If there is not enough power, additional power can be requested. If there is sufficient power, the wireless receiver can determine whether there is too much power. If there is too much power, the wireless receiver can reduce the Q factor of the resonator as described using one of the various embodiments described above. If there is not too much power, then the wireless receiver can continue to charge and periodically check to see if the power level needs to be adjusted.

Figure 10:
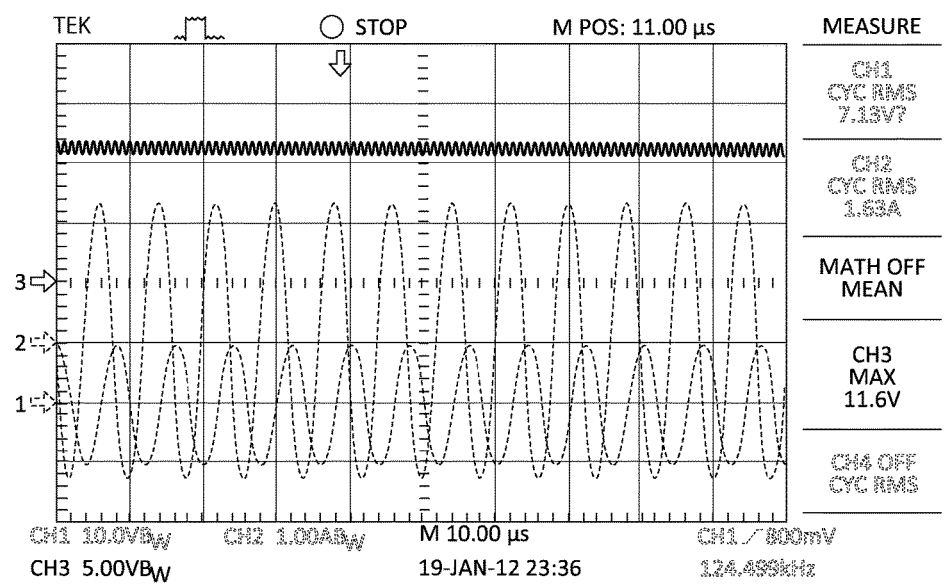
FIG. 10 is an oscilloscope snapshot of the wireless test receiver illustrating operation of one embodiment of the present invention with the resonator circuit active.
Figure 11:
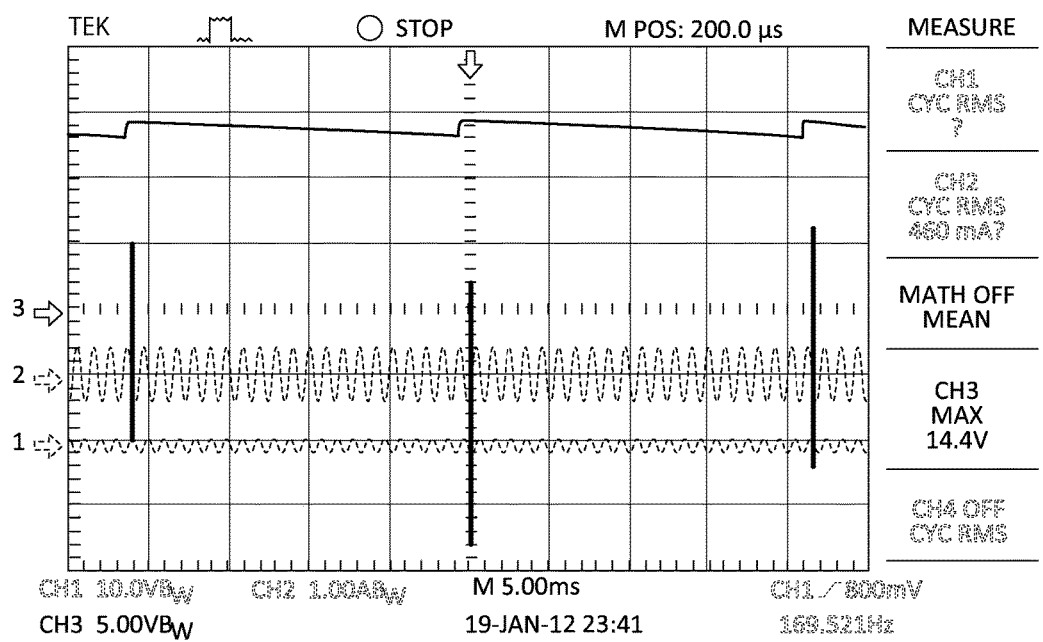
FIG. 11 is an oscilloscope snapshot of the wireless test receiver with the resonator circuit using active Q control.

FIGS. 10-12 are a series of oscilloscope snapshots showing a wireless test receiver in various configurations intended to illustrate the general operation of one embodiment of the present invention. FIG. 10 is an oscilloscope snapshot of the wireless test receiver having a resonator circuit in which the Q control is not active. In the embodiment illustrated in FIG. 10, the wireless test receiver is receiving about 5 watts of power. Channel 1 illustrates the output load voltage into a 10 ohm load. Channel 2 illustrates the current in the resonator inductor L3. Channel 3 illustrates the rectified peak reference voltage, which is illustrated as being below a 13.3 volt threshold, so high Q is maintained and the resonator circuit is configured in the resonator circuit configuration.

FIG. 11 is an oscilloscope snapshot of the wireless test receiver with the resonator circuit configured in a shunt configuration. In the embodiment illustrated in FIG. 11, channel 3 shows that when the load is removed the rectified peak reference voltage goes above 13.3 volts. That is, the secondary output spikes above the threshold. In response, the Q factor in the resonator is squelched by the secondary circuit feedback. This is the squelch causes a decrease in current through the resonant inductor L3. which is measured on channel 2. In the current embodiment, the current through the resonant inductor L3 is decreased by a factor of four, which effectively reduces the power resonated by the inductor L3 by about a factor of 16.

Figure 12A:
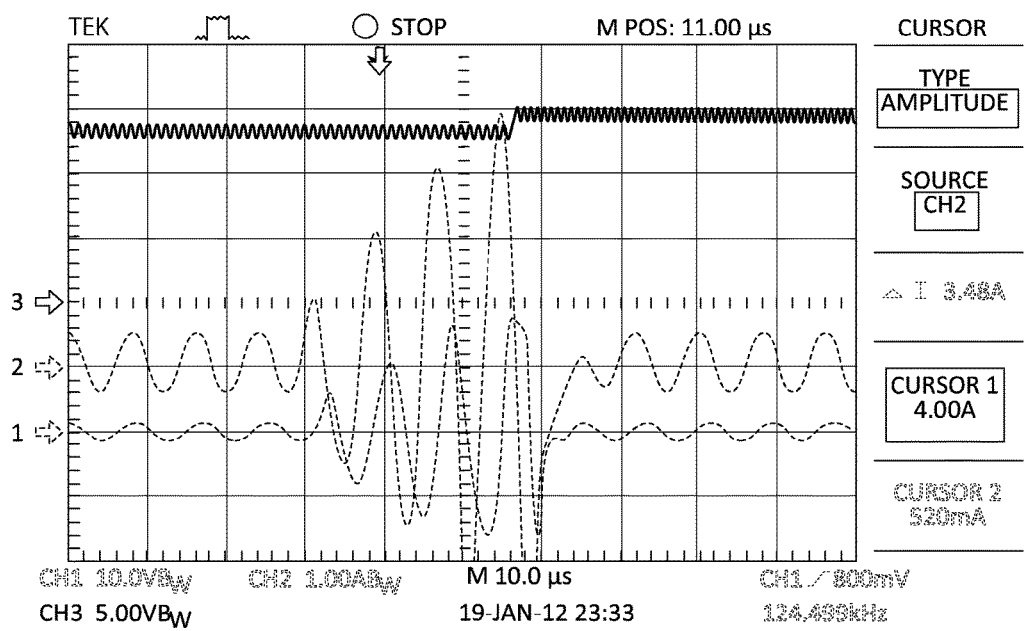
FIG. 12a is an oscilloscope snapshot of the wireless test receiver changing from an inactive state to an active state.

FIG. 12a is an oscilloscope snapshot of the wireless test receiver with the Q control circuit changing from an inactive state to an active state. That is, the snapshot captures the moment in time when the resonant circuit transitions from a resonator circuit configuration to a shunt configuration. This oscilloscope snapshot of the load presence re-detection shows that with the load removed the secondary output voltage would peak over 18 volts and the resonator inductor current would increase to over 4 amps resulting in considerable heating of the resonator inductor L3. In the depicted embodiment, the Z distance between the wireless transmitter and the wireless test receiver is about 1.22", where the coupling between transmitter and receiver is not that strong. At smaller Z distances, the Q control circuit can protect from larger voltages.

Figure 12B:
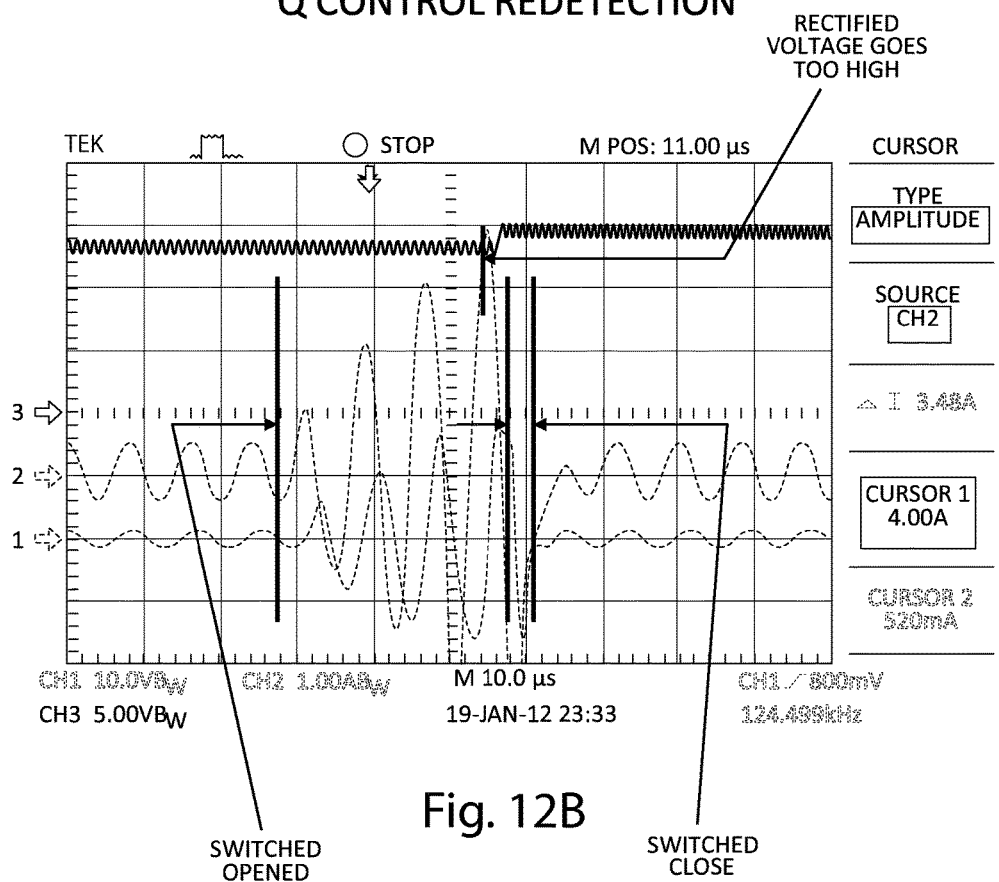
FIG. 12b is an oscilloscope snapshot of the wireless test receiver changing from an inactive state to an active state.

FIG. 12b shows an annotated version of the oscilloscope snapshot of FIG. 12a. The annotations indicate where the load was removed, where the rectified voltage goes too high, and where the Q control is activated by closing the switch Q1, thereby changing the Q factor of the resonator circuit.

Figure 13:
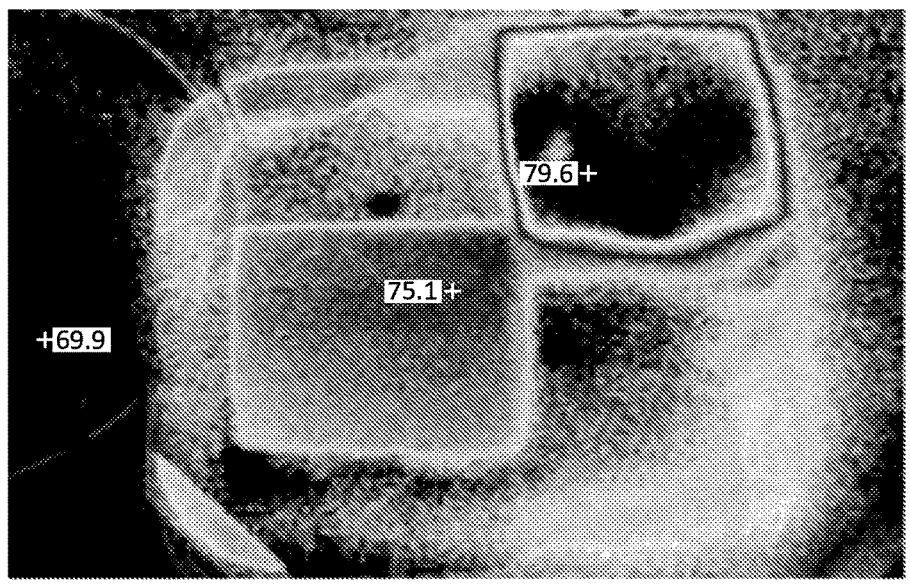
FIG. 13 is a thermal image of a conventional wireless receiver and a wireless receiver according to one embodiment.

FIG. 13 is a thermal image of a conventional wireless receiver and a wireless receiver according to one embodiment in operation for about 15 minutes. The image illustrates that the conventional wireless receiver is warmer than the wireless receiver. The thermal image illustrates two wireless receivers: the wireless receiver in the top right portion of the image is receiving about 5 W of power to its load, and the receiver at the bottom left, is unloaded but has the Q control circuit preventing it from overheating.

Figure 14:
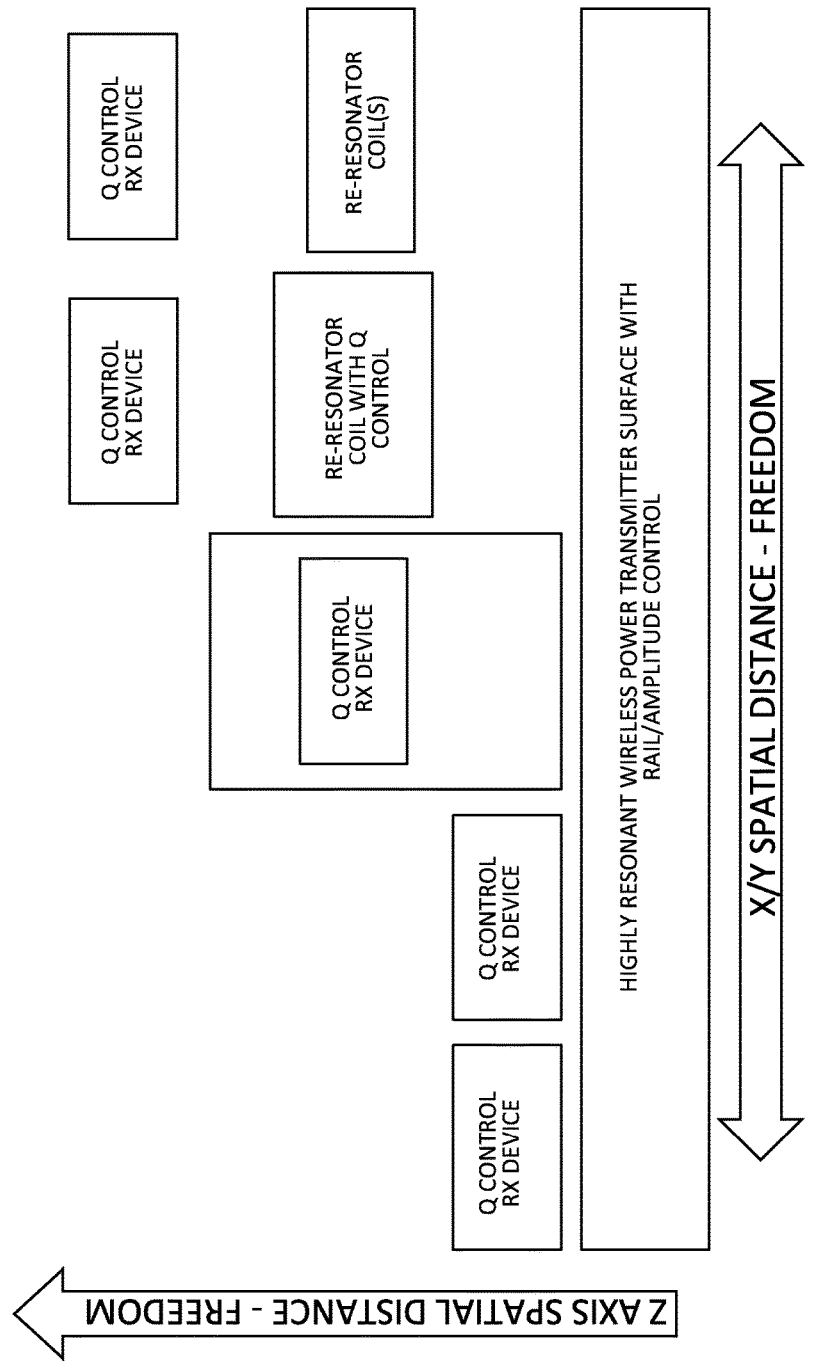
FIG. 14 is a representative view of a variety of wireless receivers, some of which include Q Control, shown receiving appropriate power at various positions (X/Y/Z axis positioning).

FIG. 14 is a representative view of a variety of wireless receivers, some of which include Q Control circuitry, shown receiving appropriate power at various positions (X/Y/Z axis positioning). The Q control circuitry enables each wireless receiver to self regulate the Q factor based on the desired output. A wireless receiver can be set directly on the surface and engage in a close coupling or mid-range coupling depending on the location of the wireless transmitter. A wireless receiver can be set inside of a bag, tool box, backpack, or other container and then the container can be set on the power transfer surface. The wireless transmitter can either couple with close coupling or with mid-range coupling to the wireless receiver in the container. A resonator coil with Q control circuitry can be placed on the power transfer surface that can relay power to another wireless receiver that itself also has Q control circuitry. Further, a resonator coil without Q control circuitry can also be placed on the power transfer surface that can relay power to another wireless receiver that itself has Q control circuitry.

Figure 15:
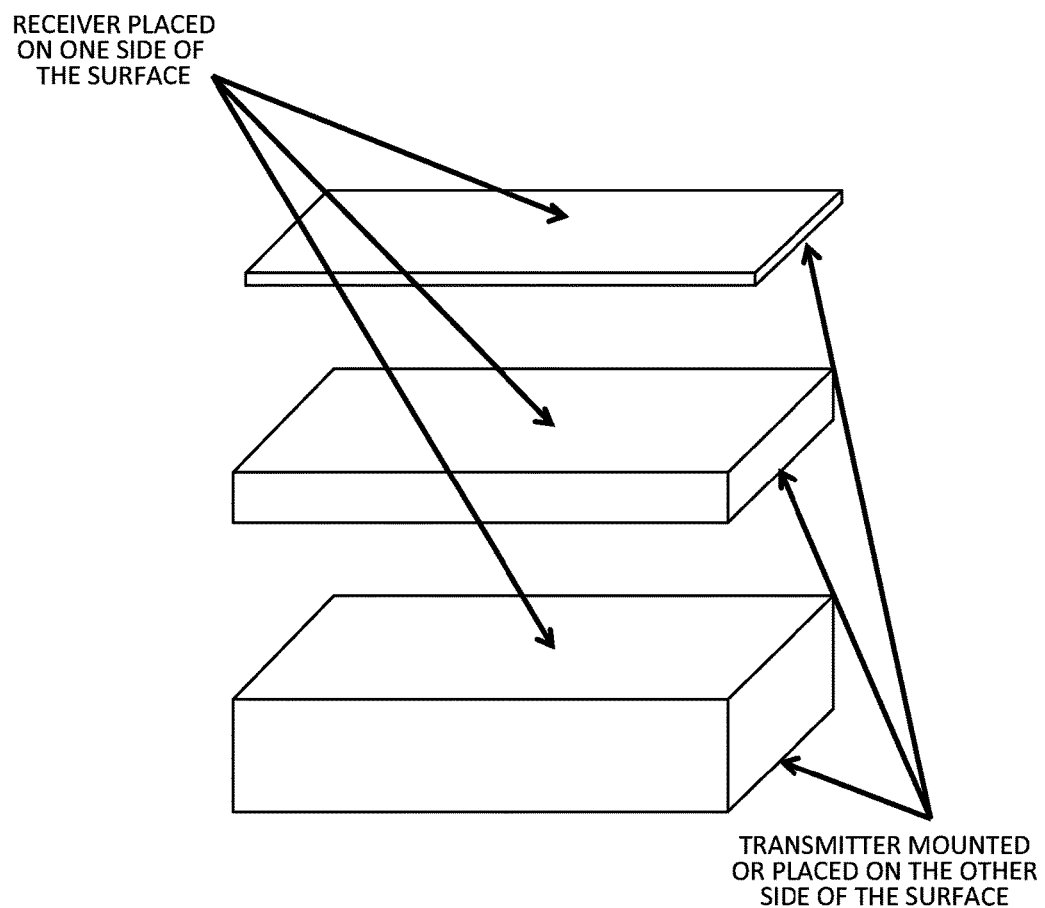

FIG. 15 is a representative view of three different charging surfaces, each having a different thickness, that the wireless receiver according to one embodiment may be capable of receiving power through any of the three surfaces. In one embodiment the transmitter can be mounted on or placed on one side of the surface. The receiver can be placed on the opposite side of the surface from the transmitter in order to receive wireless power. The Q control circuitry can actively adjust the Q factor of the receiver to receive an appropriate amount of power depending on the Z distance between the wireless power transmitter and the wireless power supply. In this way, one set of circuitry for the transmitter and one set of circuitry for a wireless receiver can be implemented without having to tune the circuitry for a specific Z distance. A user can purchase a Q control system and install it in any surface and the system can adjust appropriately with Q control for the specific gap.

Figure 16:
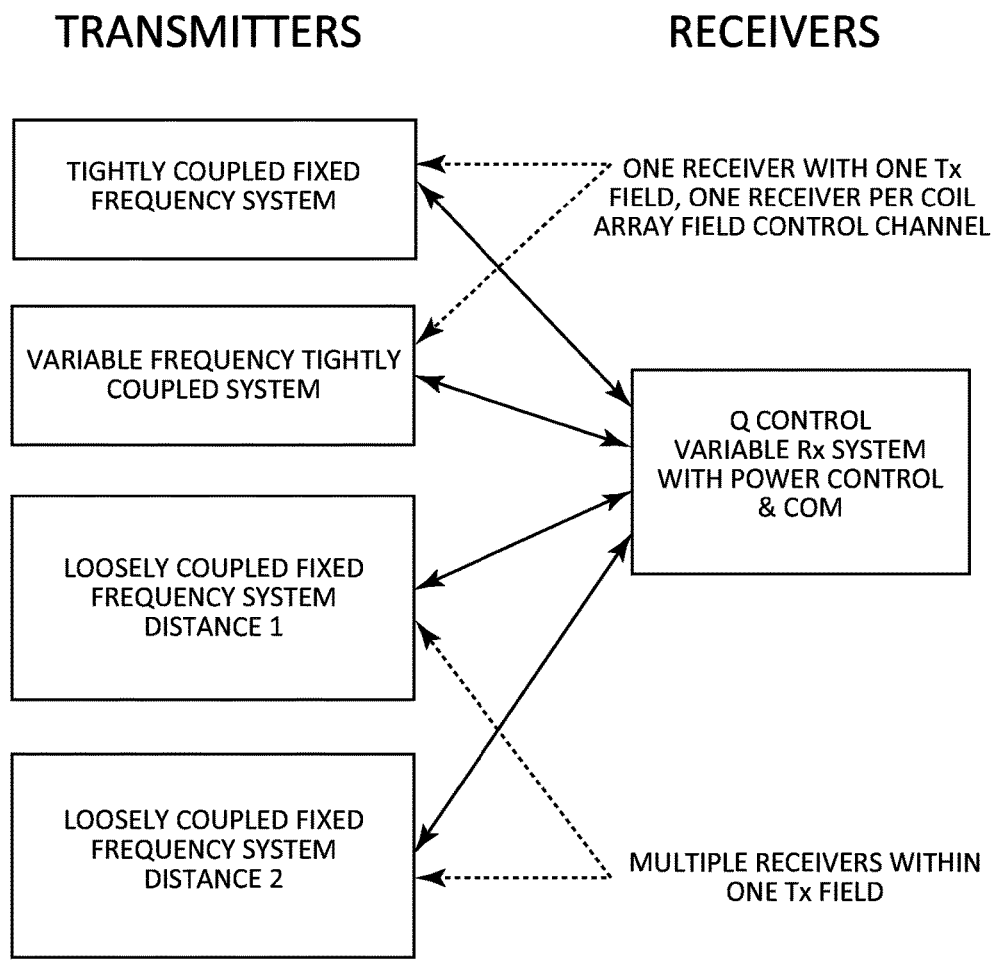
FIG. 16 is a representative view of the wireless receiver according to one embodiment being capable of receiving power from a variety of inductive power transmitters.

FIG. 16 is a representative view of a wireless power system with Q control circuitry. The figure illustrates that a wireless receiver with Q control is compatible with a variety of different wireless receivers including a tightly coupled fixed frequency power transmitter, a variable frequency tightly coupled power transmitter, a loosely coupled fixed frequency power transmitter that provides power at a first distance, and a loosely coupled fixed frequency power transmitter that provides power at a second distance. A wireless receiver according to one embodiment can receive power from multiple wireless power transmitters. The wireless receiver is compatible in a situation where there is one wireless receiver and one wireless transmitter field, with one receiver per coil array field control channel. The wireless receiver is also compatible with loosely coupled transmitters that transmit power to multiple receivers within one transmitter field.

Figure 17:
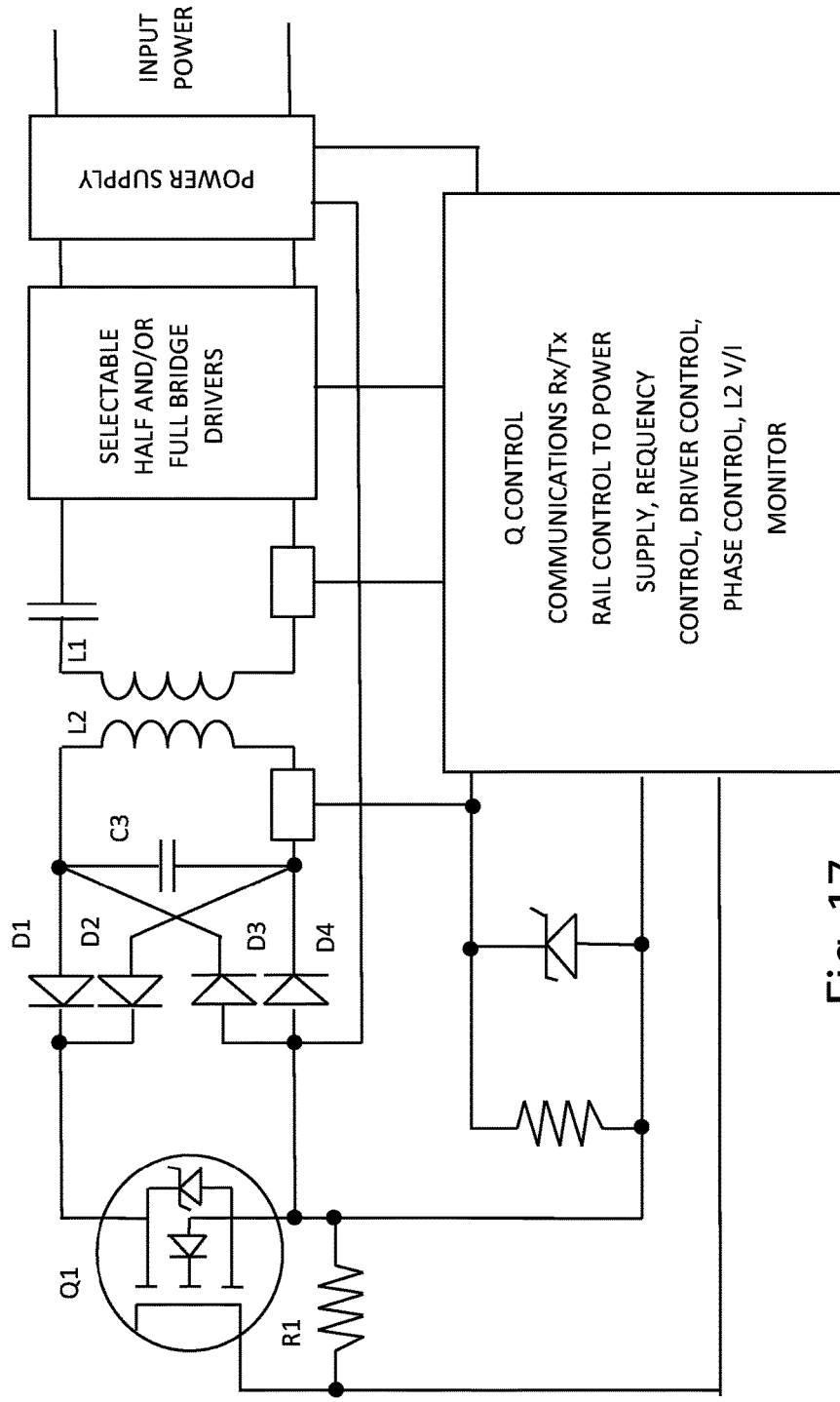
FIG. 17 is a representative view of the wireless transmitter including Q control circuitry and capable of selecting half-bridge, full-bridge, or a combination thereof driving circuitry.

FIG. 17 is a representative view of a wireless transmitter including Q control circuitry and capable of selecting half-bridge, full-bridge, or a combination thereof driving circuitry.

Figure 18:
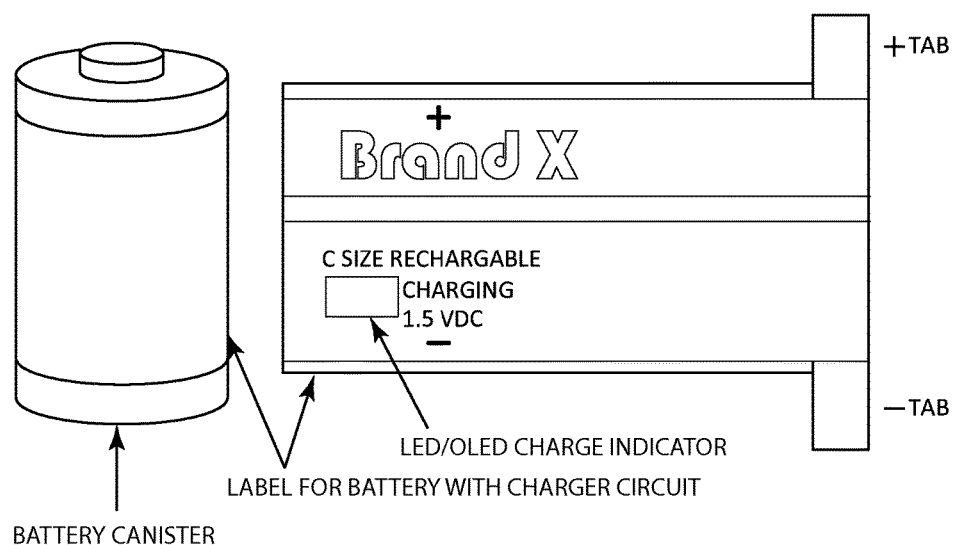
FIG. 18 is a representative view of a wireless receiver according to one embodiment incorporated into a battery.
Figure 18:
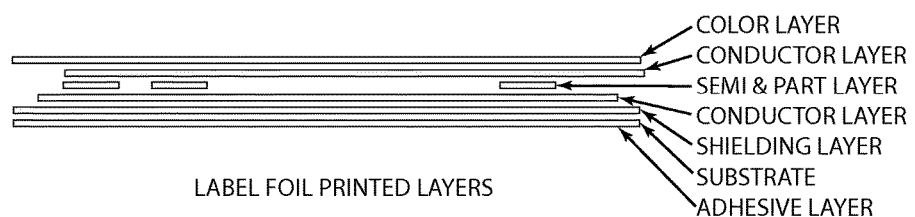

FIG. 18 is a representative view of a wireless receiver according to one embodiment incorporated into a label for a battery. The label can include multiple layers. In the illustrated embodiment, the battery label includes a color layer, a conductor layer, a semiconductor device & part layer, another conductor layer, a shielding layer, a substrate, and an adhesive layer. The layers can be foil layers or printed layers. The label can have a positive tab and a negative tab so that wireless energy transferred to the battery label can be provided to charge the battery. Although shown only representatively, the wireless receiver in the battery label may include an adjustable resonator, such as those in any other wireless receiver embodiment described herein.

Figure 23:
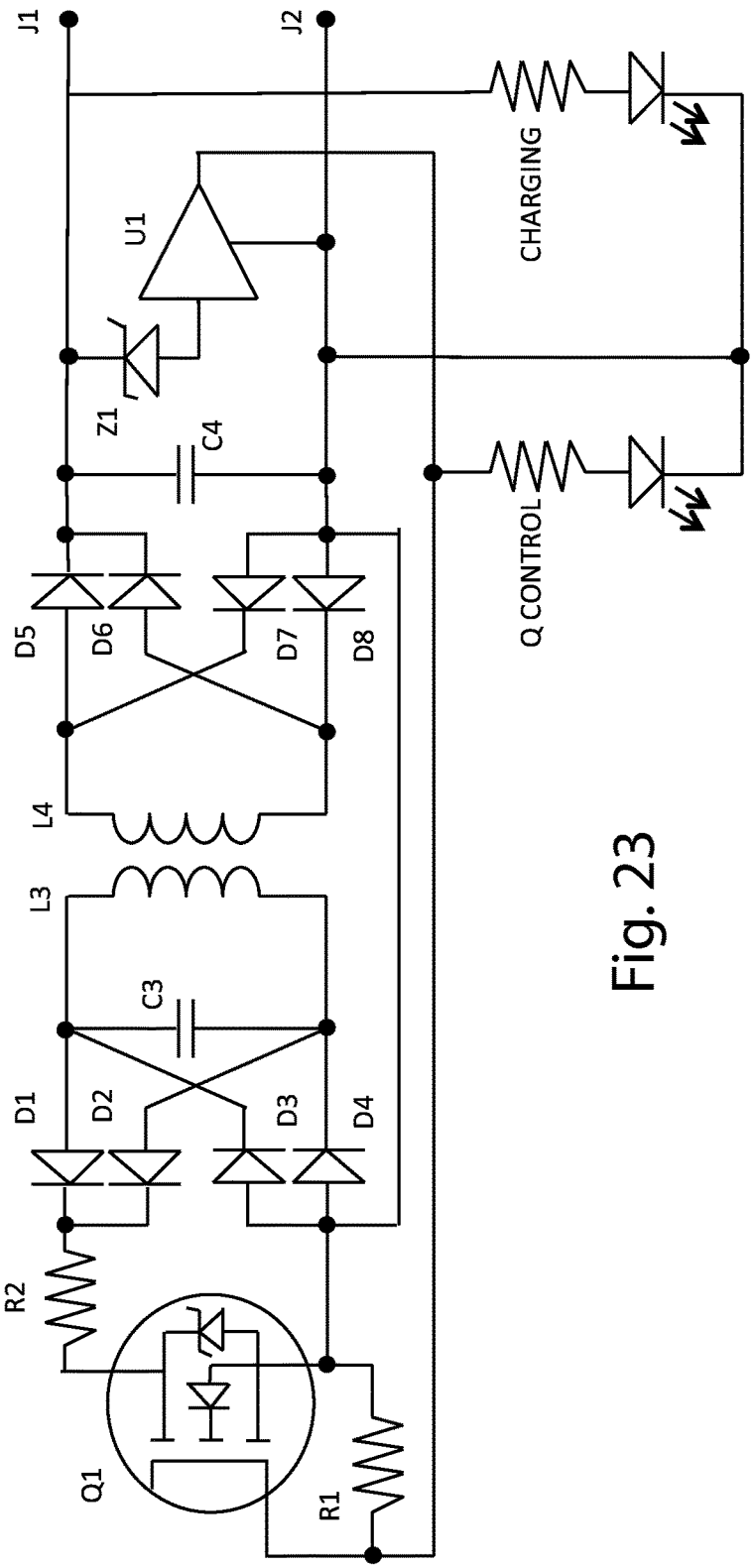
FIG. 23 is a representative schematic of a wireless receiver according to one embodiment and configured with a series resistance in the control subcircuit for Q factor control.

FIG. 23 is a representative schematic of a wireless receiver according to one embodiment. The wireless receiver includes a resistor R2 in the control subcircuit for Q factor control. The value of the resistor R2 can vary from application to application. In one embodiment, the R2 resistor is selected to provide additional resolution to the Q control. For example, when the transistor Q1 is active and the Q value of the resonator circuit is affected by the resistor R2. And when the transistor Q1 is inactive, the Q value of the resonator circuit is not affected by the resistor R2. The Q factor of the resonator circuit when Q1 is active with R2 present is different from the Q factor of the resonator circuit without R2 present. As described above, the Q factor can be controlled by actively controlling the amount of time that the Q1 transistor is active. There can be a limit to the resolution of the averaged Q factor because the amount of time that Q1 is active may only be able to be controlled at a specific resolution. By adding a resistor R2 (or controlling the Q1 transistor in the triode mode as a variable resistor) the Q factor when the transistor Q1 is active is different. Where the Q factor when R2 in the circuit is closer to the Q factor of the resonator circuit configuration, then the same control of the timing of the transistor Q1 can have a more precise effect on the Q value. For example, where the Q factors vary between zero and 100 in two configurations, if the Q factor varies between 50 and 100 in two configurations, then the change in relative timing has a more precise effect on the time averaged Q factor. The present invention may be achieve a time averaged Q factor using a variety of methodologies, including those described herein. For example, the resonator circuit L3/C3 may be selectively shunted over multiple time periods of the power signal or on a cycle-by-cycle basis. In another example, the resonator circuit L3/C3 may be controlled to select one Q factor for part of a cycle and another Q factor for another part of the cycle.

Figure 25:
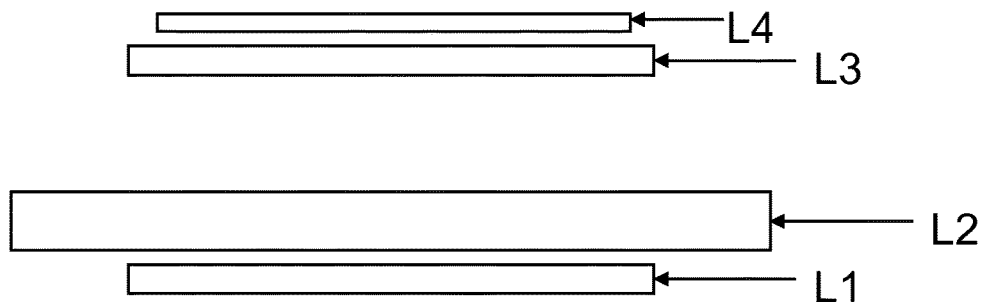
FIG. 25 is a representative view of the spatial relationship between coils of a wireless receiver and coils of an inductive power supply.
Figure 26:
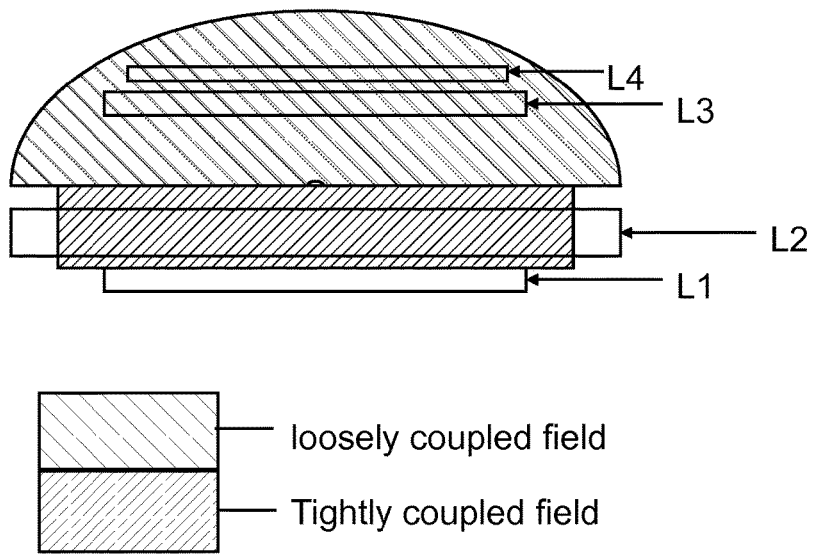
FIG. 26 is a representative view of the loosely coupled field region and tightly coupled field region between coils of a wireless receiver and coils of an inductive power supply.

FIG. 25 is a representative view of the spatial relationship between inductors of a wireless receiver L3, L4 and inductors of an inductive power supply L1, L2. FIG. 26 is a representative view of the loosely coupled field region and tightly coupled field region between inductors of a wireless receiver and inductors of a wireless power supply. Referring to the illustrated embodiments of FIGS. 25 and 26, a representative view of the loosely coupled field region and tightly coupled field region between inductors L3, L4 of a wireless receiver and inductors L1, L2 of an inductive power supply are shown. As illustrated, the resonator inductor L3 and secondary inductors L4 are within the loosely coupled field region. The inductors L3 and L4 may move, as the user moves the wireless receiver with respect to the inductive power supply for example, within the loosely coupled field region and to the tightly coupled field region.

Figure 27:
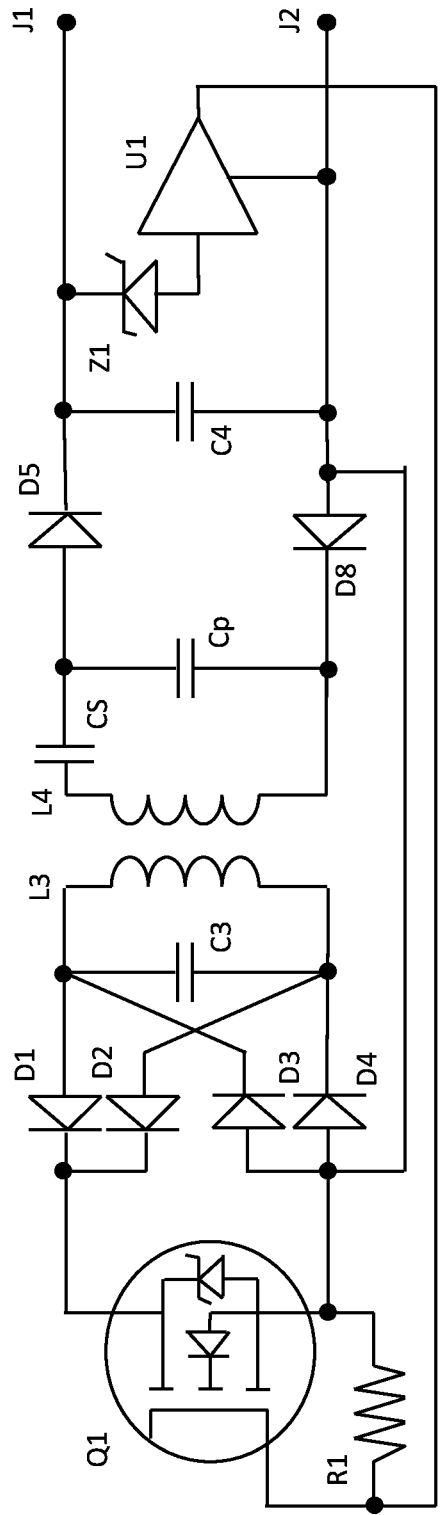
FIG. 27 is a representative schematic of some optional components that may be incorporated into an embodiment of the wireless receiver.

As shown in the illustrated embodiment of FIG. 27, the secondary coil L4 may be coupled to a series resonant capacitor Cs, a parallel resonant capacitor Cp, or a combination thereof. These capacitors Cs, Cp, alone or in combination, may provide for resonant operation of the secondary coil L4. In some embodiments, an inductive power supply may be configured to identify the wireless receiver based on presence of capacitors Cs, Cp, alone or in combination. For example, parallel resonant capacitor Cp may provide a resonant frequency signature for the wireless receiver, allowing for identification of the wireless receiver based detection of the signature.

The illustrated embodiment of FIG. 27 also includes a half-wave rectifier D5, D8 to power the analog feedback circuitry, including the driver U1 and zener diode Z1. A separate full bridge rectifier (not shown) may be used to provide power to a load from secondary coil L4.

Figure 31:
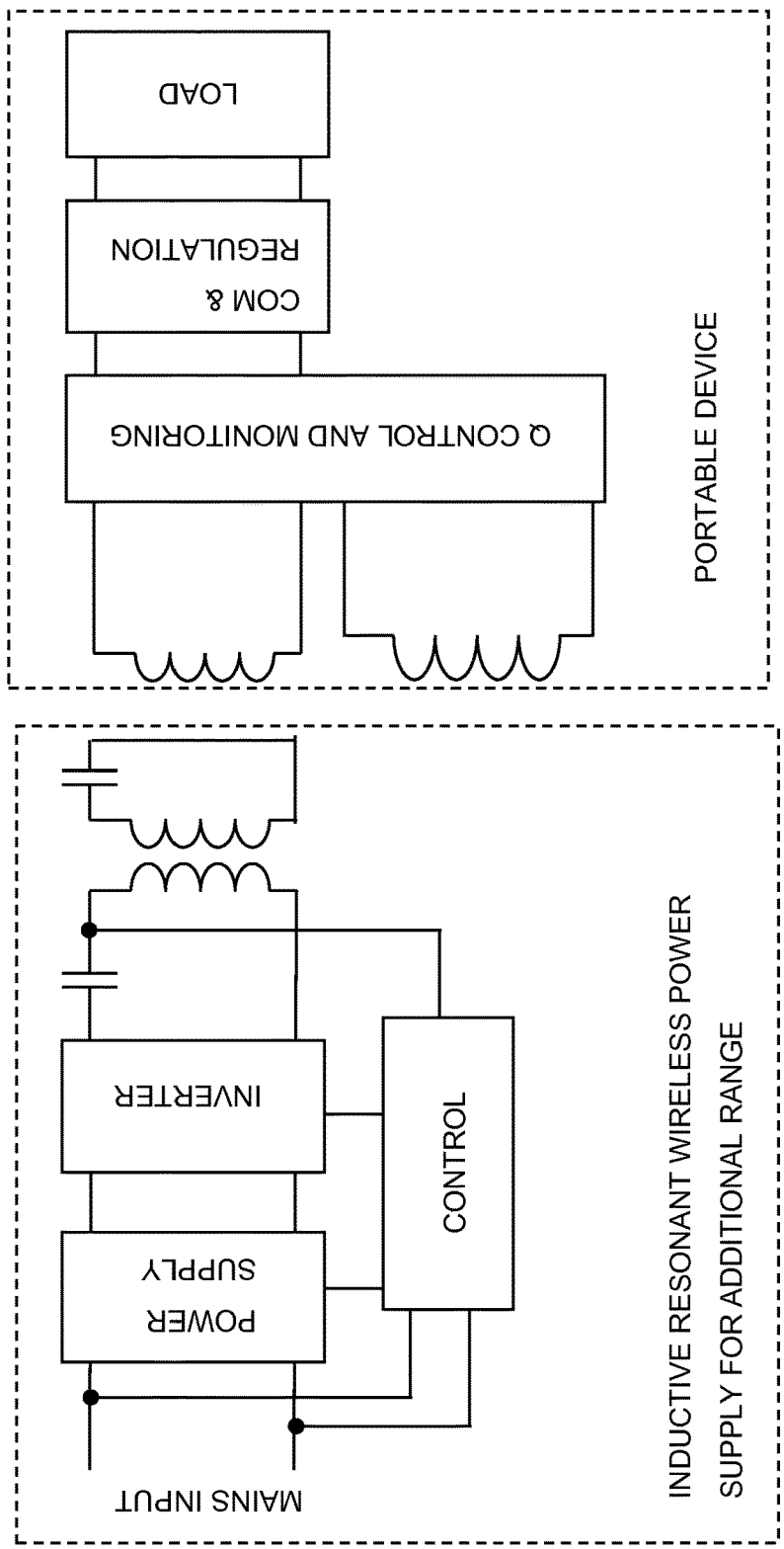
FIG. 31 is a representative view of a wireless power transmitter and a portable device having Q factor control.

FIG. 31 illustrates an embodiment of the wireless receiver incorporated into a portable device. The wireless receiver include both Q control circuitry and monitoring circuitry coupled to a secondary inductor and a resonator inductor. With this configuration, the portable device may control the amount of power transferred to communication and regulation circuitry such that the regulation circuitry may receive power within an appropriate range.

Figure 32:
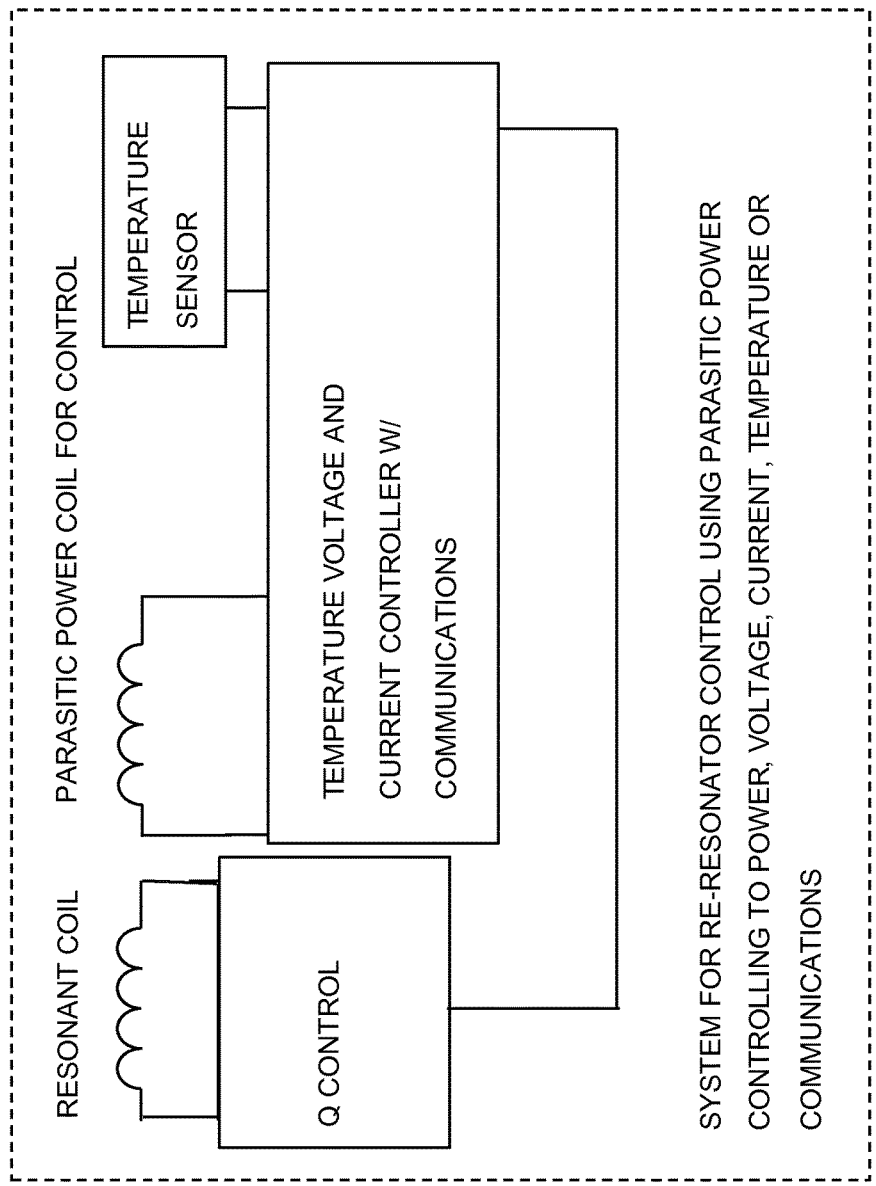
FIG. 32 is a representative view of a wireless power receiver configured to control Q factor.

The embodiment illustrated in FIG. 32 includes a temperature sensor that provides information to a controller, which may control operation of the Q control circuitry based on the sensed temperature information. For instance, if the sensed temperature of the circuitry or pan, for example, is above a threshold, the Q control circuitry may configure the resonator coil to reduce the amount of power being received. As another example, if the sensed temperature is below a threshold, the Q control circuitry may configure the resonator coil to increase the amount of power being received.

Figure 33:
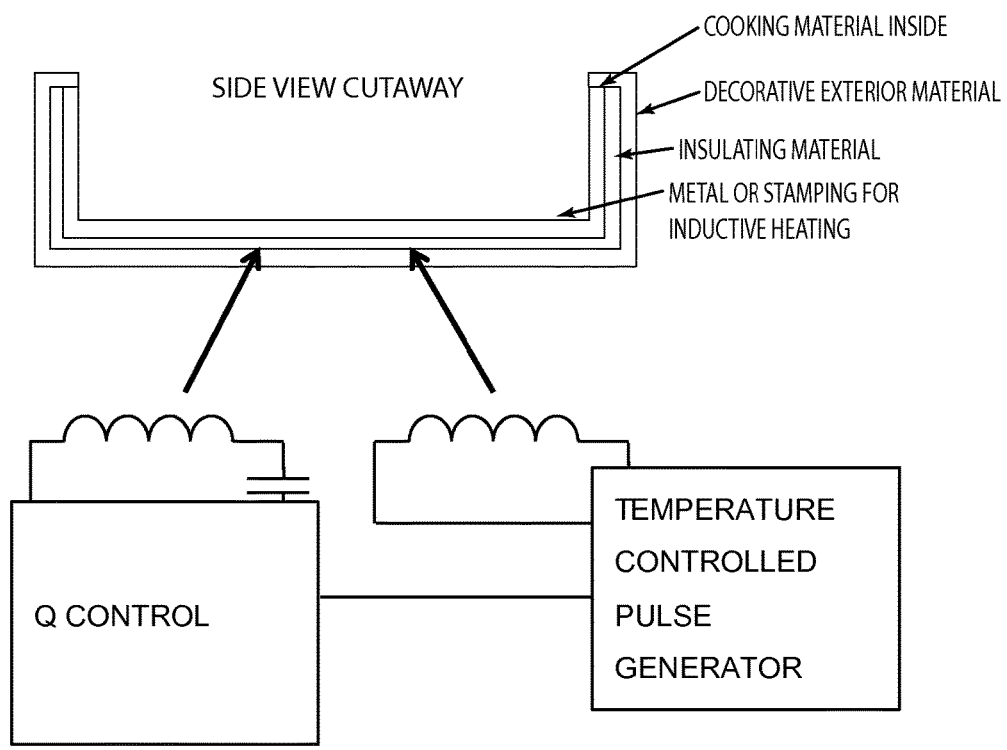
FIG. 33 is a representative view of a wireless power receiver incorporated into inductive cookware.

In the illustrated embodiment of FIG. 33, circuitry of other embodiments may incorporated into inductive cookware for controlling the amount of power received by the resonator. For example, the inductive cookware may include temperatures control circuitry and Q control circuitry for controlling the amount of power received in order to maintain a desired temperature. That is, based on a sensed temperature, the Q control circuitry may increase or decrease the amount of power being received by affecting the Q factor of the resonator circuitry.

For purposes of disclosure, the Q control circuitry is described in connection with inductive cookware in the illustrated embodiment of FIG. 33, but other inductive cookware may be used, such as those described in U.S. Ser. No. 13/143,517, entitled "Smart Cookware" and filed Jul. 6, 2011, to Baarman et al. and U.S. Ser. No. 61/584,281, entitled "Inductive Cooking System" and filed Jan. 8, 2012, to Baarman et al.—which are incorporated herein by reference in their entirety.

Figure 34:
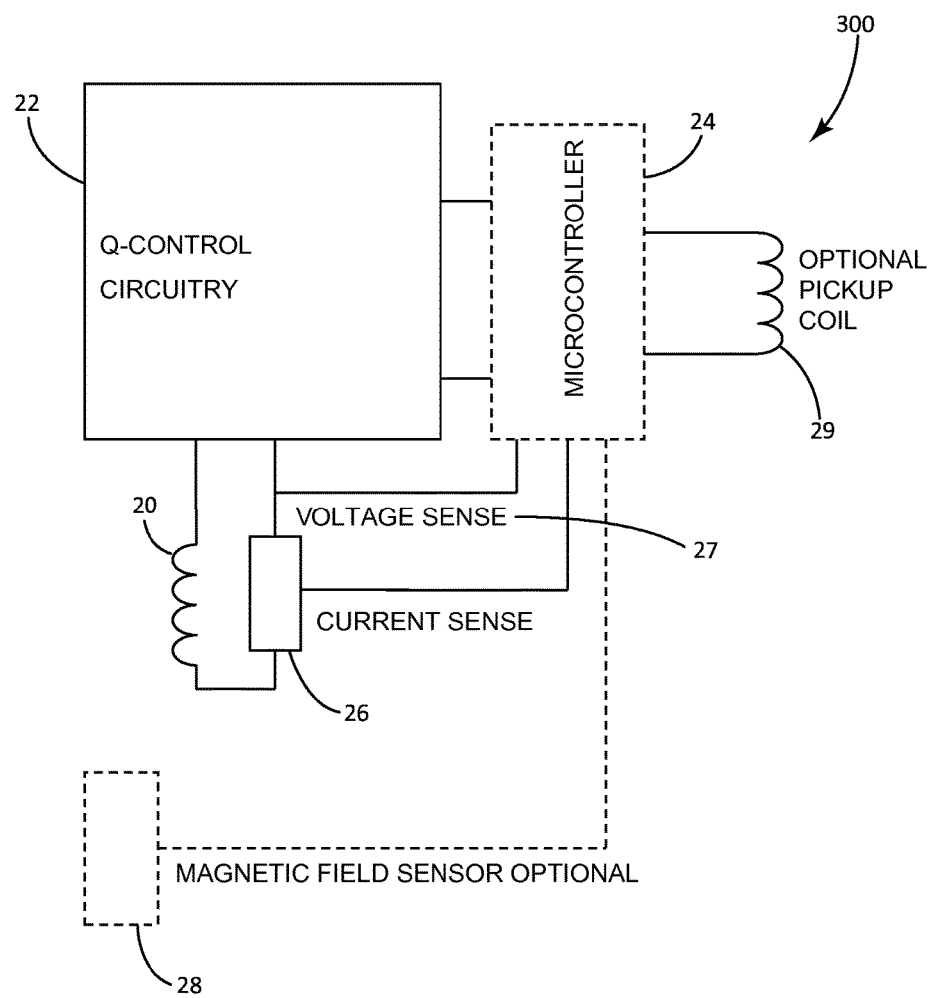
FIG. 34 is a representative view of a field extender according to one embodiment of the present invention.

A stand-alone field extender 300 according to one embodiment of the present invention and incorporating an intermediate resonator 20 is shown, for example, in the illustrated embodiment of FIG. 34. As mentioned above, intermediate resonators 20 may be located separate from a wireless receiver and a wireless transmitter. In this way, one or more intermediate resonators 20 may be incorporated in a stand-alone configuration, such as the stand-alone field extender 300.

In this embodiment, the stand-alone field extender 300 may also include control circuitry 22 similar to the control subcircuit described with respect to the illustrated embodiment of FIG. 2. The stand-alone field extender 300 may optionally include a controller 24 similar to the controller described with respect to other embodiments herein. That is, the controller 24 may be coupled to the control subcircuit 22 to control the Q factor of the intermediate resonator 20 and the field level. The controller 24 may base Q factor control on output from one or more sensors. For example, the stand-alone field extender 300 may incorporate a current sensor 26, a voltage sensor 27, or a magnetic field sensor 28, or a combination thereof in order to provide sensed information to the controller 24.

In one embodiment of the stand-alone field extender 300, the controller 24 may receive power by coupling to the intermediate resonator 20 through a rectifier (not shown). With this configuration, the stand-alone field extender 300 may not incorporate its own power supply or receive operating power through direct electrical contacts. Alternatively, the stand-alone field extender 300 may incorporate an optional pick-up coil 29 capable of receiving power inductively and powering the controller 24 and other circuitry in the stand-alone field extender 300.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The embodiments of the invention in which an exclusive property or privilege is claimed are as follows:

1. A wireless power transfer component comprising:
   a resonator circuit adapted to receive power generated by a primary inductor of a wireless power transmitter, said resonator circuit adapted to relay wireless power from the wireless power transmitter to a secondary-side inductor of a wireless power receiver, the resonator circuit having a Q value; and
   a Q control subcircuit configured to selectively adjust said Q value of said resonator circuit to control an amount of power relayed by said resonator circuit.

2. The wireless power transfer component of claim 1 wherein said resonator circuit and said Q control subcircuit are disposed within at least one of a wireless power transmitter, a wireless power receiver and an intermediate power relay component configured to relay power from the primary inductor of the wireless power transmitter to the secondary circuit of the wireless power receiver.

3. The wireless power transfer component of claim 1 wherein said resonator circuit includes an inductance and a capacitance.

4. The wireless power transfer component of claim 1 wherein said resonator circuit includes a tank circuit having an inductor and a capacitor.

5. The wireless power transfer component of claim 4 wherein said Q control subcircuit is coupled to said resonator circuit and is configured to selectively shunt said capacitor.

6. The wireless power transfer component of claim 4 wherein said Q control subcircuit is coupled to said resonator circuit and is configured to selectively provide a resistance parallel to said capacitor.

7. The wireless power transfer component of claim 4 wherein said Q control subcircuit is coupled in series with said inductor and said capacitor.

8. The wireless power transfer component of claim 1 wherein said Q control subcircuit is configured to vary said Q value between a first Q value and a second Q value, said second Q value being different from said first Q value.

9. The wireless power transfer component of claim 1 wherein said Q control subcircuit is configured to vary said Q value between a first Q value for a first portion of a power supply cycle and a second Q value for a second portion of said power supply cycle, said first Q value being different from said second Q value.

10. The wireless power transfer component of claim 1 wherein said Q control subcircuit is configured to vary said Q value between a first Q value for a first plurality of power supply cycles and a second Q value for a second plurality of power supply cycles, said first Q value being different from said second Q value.

11. The wireless power transfer component of claim 1 wherein said resonator circuit and said Q control subcircuit are disposed within at least one of a wireless power receiver and an intermediate power relay component; and
further including a communications transmitter configured to transmit communications representative of said Q value to a wireless power transmitter, whereby said wireless power transmitter may control an amount of power transmitted by said wireless power transmitter base on said Q value.

12. A resonator circuit comprising:
a resonant inductor;
a resonant capacitor, said resonant inductor and said resonant capacitor arranged to form a tank circuit having a Q value;
wherein said tank circuit is adapted to receive power generated by a primary inductor of a wireless power transmitter, said tank circuit adapted to relay wireless power from the wireless power transmitter to a secondary-side inductor of a wireless power receiver;
wherein said resonator circuit is configured to actively adjust said Q value of said tank circuit in response to a control variable; and
wherein said resonant circuit is configured to selectively adjust the Q value to control an amount of power relayed by the resonator circuit.

13. The resonator circuit of claim 12 wherein said control variable is representative of an operating characteristic of a wireless power receiver.

14. The resonator circuit of claim 13 wherein said operating characteristic is at least one of a temperature, voltage, current and power of a wireless power receiver.

15. The resonator circuit of claim 12 wherein said control variable is representative of an operating characteristic external to a wireless power receiver.

16. The resonator circuit of claim 15 wherein said operating characteristic is a temperature of a battery.

17. The resonator circuit of claim 12 wherein said resonator circuit is configured to vary said Q value between a first Q value and a second Q value different from said first Q value.

18. The resonator circuit of claim 12 wherein said resonator circuit is configured to vary said Q value between a first Q value for a first portion of a power supply cycle and a second Q value for a second portion of said power supply cycle, said first Q value being different from said second Q value.

19. The resonator circuit of claim 12 wherein said resonator circuit is configured to vary said Q value between a first Q value for a first plurality of power supply cycles and a second Q value for a second plurality of power supply cycles, said first Q value being different from said second Q value.

20. A resonator circuit comprising:
a resonant inductor;
a resonant capacitor, said resonant inductor and said resonant capacitor arranged to form a tank circuit having a Q value;
wherein said tank circuit is adapted to receive power generated by a primary inductor of a wireless power transmitter, said tank circuit adapted to relay wireless power from the wireless power transmitter to a secondary-side inductor of a wireless power receiver; and
a Q control subcircuit coupled to said tank circuit and being selectively adjustable to selectively vary said Q value of said tank circuit to control an amount of power relayed by the resonant circuit, said Q control subcircuit configured to selectively adjust said Q value in response to a control variable.

21. The resonator circuit of claim 20 wherein said Q control subcircuit is connected to said resonant inductor in parallel to said resonant capacitor.

22. The resonator circuit of claim 21 wherein said Q control subcircuit is configured to selectively shunt said resonant capacitor.

23. The resonator circuit of claim 21 wherein said Q control subcircuit is configured to selectively apply a resistance in parallel to said resonant capacitor.

24. The resonator circuit of claim 20 wherein said Q control subcircuit is connected to in series with said resonant inductor and said resonant capacitor.

25. The resonator circuit of claim 20 wherein said Q control subcircuit includes a switch to selectively shunt said resonant capacitor or to selectively provide a resistance in parallel to said resonant capacitor.

26. The resonator circuit of claim 25 wherein said switch includes one or more transistors.

27. The resonator circuit of claim 25 wherein said Q control subcircuit includes a rectifier and said switch is disposed on a rectified side.

28. The resonator circuit of claim 25 wherein said switch is an AC switch.

29. The resonator circuit of claim 25 wherein said control variable is representative of an operating characteristic of a wireless power receiver.

30. The resonator circuit of claim 25 said wherein said Q control subcircuit is configured to vary said Q value between a first Q value and a second Q value different from said first Q value.

31. The resonator circuit of claim 25 wherein said Q control subcircuit is configured to vary said Q value between a first Q value for a first portion of a power supply cycle and a second Q value for a second portion of said power supply cycle, said first Q value being different from said second Q value.

32. The resonator circuit of claim 25 wherein said Q control subcircuit is configured to vary said Q value between a first Q value for a first plurality of power supply cycles and a second Q value for a second plurality of power supply cycles, said first Q value being different from said second Q value.

33. The resonator circuit of claim 20 wherein said Q control subcircuit is configured to actively adjust said Q value to control an amount of power relayed through said resonator circuit to a secondary circuit.

34. The resonator circuit of claim 33 wherein said Q control subcircuit is actively controlled by feedback to control and an amount of power.

35. The resonator circuit of claim 20 further including a secondary circuit, said secondary circuit including a feedback circuit configured to actuate said Q control subcircuit.

36. The resonator circuit of claim 35 wherein said feedback circuit includes a sensor configured to sense a characteristic in said secondary circuit, said feedback circuit configured to actuate said Q control subcircuit as a function of said sensed characteristic.

37. The resonator circuit of claim 36 wherein said sensed characteristic is at least one of a temperature, a current, a voltage or a power.

38. The resonator circuit of claim 35 wherein said feedback circuit actuates said Q control subcircuit to satisfy a threshold.

39. The resonator circuit of claim 38 wherein said feedback circuit actuates said Q control subcircuit to vary said Q value when said threshold is crossed.

40. The resonator circuit of claim 20 wherein said Q control subcircuit includes a variable resistor.

41. The resonator circuit of claim 40 wherein said variable resistor is a transistor operating in a triode mode or a linear region.

42. The resonator circuit of claim 40 wherein said Q control subcircuit is actively controlled by a feedback circuit, said feedback circuit configured to provide a proportional feedback signal to said Q control subcircuit varying a value of said variable resistor in proportion to said feedback signal.

43. The resonator circuit of claim 40 wherein said Q control subcircuit is actively controlled by a feedback circuit, said feedback circuit including a controller capable of adjusting a feedback signal based on an algorithm.

44. The resonator circuit of claim 43 wherein said algorithm is configured to adjust said feedback signal based on a relative difference between a sensed value and a desired value of a sensed characteristic.

45. The resonator circuit of claim 44 wherein said algorithm is a proportional, integral, derivative algorithm.

46. The resonator circuit of claim 40 wherein said Q control subcircuit is actively controlled by a feedback circuit, said feedback circuit including at least one analog component that provides direct feedback of said Q control subcircuit.

47. The resonator circuit of claim 46 wherein said at least one analog component is configured to provide a high signal or a low signal depending on whether a threshold value is satisfied.

48. The resonator circuit of claim 46 wherein said feedback circuit includes a digital controller, said digital controller receiving an analog input and configured to generate a control signal for said Q control subcircuit.

49. The resonator circuit of claim 20 further including a shut-off circuit capable of shutting off said resonator circuit to effectively eliminate said resonator circuit from a wireless power supply system.

50. The resonator circuit of claim 49 wherein said Q control subcircuit functions as said shut-off circuit.

51. The resonator circuit of claim 49 wherein said shut-off circuit is separate from said Q control subcircuit.

52. The resonator circuit of claim 49 further including a sensor for sensing a value relevant to control of said shut-off circuit.

53. A wireless power transmitter comprising:
a primary inductor;
a primary resonator circuit having a Q value;
wherein said primary resonator circuit is adapted to receive power generated by said primary inductor of the wireless power transmitter, said primary resonator circuit adapted to relay wireless power from said primary inductor to a secondary-side inductor of a wireless power receiver; and
a Q control subcircuit configured to selectively adjust said Q value to regulate an amount of power emanating from said wireless power transmitter.

54. The wireless power transmitter of claim 53 wherein said Q control subcircuit includes a controller configured to control said Q control subcircuit as a function of a control characteristic.

55. The wireless power transmitter of claim 54 wherein said control characteristic is selected such that said Q value is adjusted to limit an amount of power transmitted to correspond with an amount of power desired by one or more wireless power receivers.

56. The wireless power transmitter of claim 53 further include one or more wireless power receivers, each of said wireless power receivers having a Q control status and being configured to communicate said Q control status to said wireless power transmitter.

57. The wireless power transmitter of claim 56 wherein said wireless power transmitter is configured to reduce said Q value of said primary resonator circuit when said Q control status indicates that all of said wireless power receivers are using Q control to limit an amount of power received.

58. The wireless power transmitter of claim 56 wherein said wireless power transmitter is configured to reduce an amount of power transmitted when said Q control status indicates that all wireless power receivers are using Q control to limit an amount of power received.

* * * * *